(12) United States Patent
Wang

(10) Patent No.: US 6,868,015 B2
(45) Date of Patent: Mar. 15, 2005

(54) SEMICONDUCTOR MEMORY ARRAY OF FLOATING GATE MEMORY CELLS WITH CONTROL GATE SPACER PORTIONS

(75) Inventor: Chih Hsin Wang, San Jose, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 334 days.

(21) Appl. No.: 09/916,619

(22) Filed: Jul. 26, 2001

(65) Prior Publication Data

US 2002/0034846 A1 Mar. 21, 2002

Related U.S. Application Data

(60) Provisional application No. 60/234,314, filed on Sep. 20, 2000, provisional application No. 60/233,988, filed on Sep. 20, 2000, and provisional application No. 60/242,096, filed on Oct. 19, 2000.

(51) Int. Cl.[7] ..................... G11C 11/34; H01L 21/8238
(52) U.S. Cl. ..................... 365/185.29; 365/185.17; 365/185.33; 438/200; 438/257
(58) Field of Search ................. 365/185, 185.01, 365/185.08, 185.05, 185.33, 182, 185.17, 185.29

(56) References Cited

U.S. PATENT DOCUMENTS

| | | |
|---|---|---|
| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |

(List continued on next page.)

FOREIGN PATENT DOCUMENTS

EP    0 389 721 A2    10/1990

OTHER PUBLICATIONS

U.S. Appl. No. 09/401,622, filed Sep. 22, 1999, Johnson.

*Primary Examiner*—David Nelms
*Assistant Examiner*—Renee R. Berry
(74) *Attorney, Agent, or Firm*—Gray Cary Ware & Freidenrich LLP

(57) ABSTRACT

A self aligned method of forming a semiconductor memory array of floating gate memory cells in a semiconductor substrate has a plurality of spaced apart isolation regions and active regions on the substrate substantially parallel to one another in the column direction. Floating gates are formed in each of the active regions by forming a conductive layer of material. Trenches are formed in the row direction across the active regions, and are filled with a conductive material to form blocks of conductive material that are the control gates. Sidewall spacers of conductive material are formed along the floating gate blocks to give the floating gates protruding portions that extend over the floating gate.

8 Claims, 23 Drawing Sheets

U.S. PATENT DOCUMENTS

| | | | |
|---|---|---|---|
| 5,293,337 A | * | 3/1994 | Aritome et al. ............. 365/185 |
| 5,429,965 A | | 7/1995 | Shimoji |
| 5,493,138 A | | 2/1996 | Koh |
| 5,544,103 A | | 8/1996 | Lambertson |
| 5,572,054 A | | 11/1996 | Wang |
| 5,751,048 A | | 5/1998 | Lee et al. |
| 5,780,341 A | | 7/1998 | Ogura |
| 5,780,892 A | | 7/1998 | Chen |
| 5,789,293 A | | 8/1998 | Cho et al. |
| 5,796,139 A | | 8/1998 | Fukase |
| 5,808,328 A | | 9/1998 | Nishizawa |
| 5,811,853 A | | 9/1998 | Wang |
| 5,814,853 A | | 9/1998 | Chen |
| 6,091,104 A | | 7/2000 | Chen |
| 6,103,573 A | | 8/2000 | Harari et al. |
| 6,140,182 A | | 10/2000 | Chen |
| 6,157,575 A | * | 12/2000 | Choi ..................... 365/185.29 |
| 6,222,227 B1 | | 4/2001 | Chen |
| 6,252,799 B1 | * | 6/2001 | Liu et al. ............... 365/185.08 |
| 6,329,685 B1 | | 12/2001 | Lee |
| 6,525,371 B2 | | 2/2003 | Johnson et al. |
| 6,563,167 B2 | | 5/2003 | Chern |

* cited by examiner

SEMICONDUCTOR MEMORY ARRAY OF FLOATING GATE MEMORY CELLS WITH CONTROL GATE SPACER PORTIONS

PRIORITY

This application claims the benefit of U.S. Provisional Application No. 60/234,314, filed Sep. 20, 2000, and entitled Super Self-Aligned Flash EEPROM Cell, and U.S. Provisional Application No. 60/233,988, filed Sep. 20, 2000, and entitled Super Self-Aligned Flash EEPROM Cell, and U.S. Provisional Application No. 60/242,096, filed Oct. 19, 2000, and entitled Ultra Self-Aligned Flash EEPROM Cell With SAC.

TECHNICAL FIELD

The present invention relates to a self-aligned method of forming a semiconductor memory array of floating gate memory cells of the split gate type. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

In the split-gate architecture, the control-gate FET is known to play a major role in disturbing mirror cells, as well as affecting the programming injection efficiency for source-side-injection FLASH cells. A good process control on the Lcg (also called the WL (word-line) poly length, which is the length of the control or select gate that is disposed over the channel) can ensure a full turn-off of the control-gate device, and hence can effectively prevent any disturbance in a mirror cell during programming (program disturb). The present invention is a method to realize a self aligned FLASH cell with improved full turn-off of the control-gate device with better program disturb characteristics. The present invention is also such a device.

SUMMARY OF THE INVENTION

In the present invention, the WL (control/select gate) poly length is controlled by a photo lithography process, which provides excellent scalability and control over the WL poly length as compared to a WL poly formed by a spacer etch process. Since the tight control on the photo process is a by-product of logic technology, the present invention thus offers a better control on WL poly length, and hence a better suppression of program disturb in mirror cells. An additional advantage of the present invention is that it allows the formation of cells with different WL poly lengths on the same wafer.

The present invention also results in the formation of the WL poly having a substantially rectangular shape or planar sidewall portion, which makes it easier and more controllable to form the side wall spacer, and to address issues of WL-to-BL (Bit Line) & WL-to-source block shorts. Further, the WL poly is defined by a WL trench rather than by a spacer etch. Thus, the memory cell is immune from WL-WL shorts due to isolation or trench oxide-to-active topography, and the WL poly has a flat surface which makes contact formation on the WL strap easier (no WL wrap needed). The present invention further presents an advantage over prior art in that it enables to the option to perform "after development inspection" for critical dimension inspection, e.g. after the photo lithography definition of the WL dimension. If the control on the critical dimension WL is off target, the error can be detected and the wafer can be re-worked to correctly define this critical dimension.

The present invention is a self-aligned method of forming a semiconductor memory array of floating gate memory cells in a semiconductor substrate, each memory cell having a floating gate, a first terminal, a second terminal with a channel region therebetween, and a control gate. In the method of the present invention, a plurality of spaced apart isolation regions are formed on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material. A plurality of spaced apart first trenches are formed across the active regions and isolation regions which are substantially parallel to one another and extend in a second direction that is substantially perpendicular to the first direction, each of the first trenches being substantially rectangularly shaped and exposing the first layer of the conductive material in each of the active regions. A second layer of insulation material is formed in each of the active regions that is disposed adjacent to and over the first layer of conductive material. Each of the first trenches are filled with a second conductive material to form blocks of the second conductive material having a substantially rectangular shape, wherein for each of the active regions, each of the blocks is adjacent to the second layer of insulation material and is insulated from the substrate. A sidewall spacer of a conductive material is formed immediately adjacent to and contiguous with each of the blocks along the second direction, wherein for each active region each spacer is disposed over the second layer of insulation material and the first layer of conductive material. A plurality of first terminals are formed in the substrate, wherein in each of the active regions each of the first terminals is adjacent to one of the blocks. And, a plurality of second terminals are formed in the substrate, wherein in each of the active regions each of the second terminals is spaced apart from the first terminals and is below the first layer of conductive material.

In another aspect of the present invention, a plurality of spaced apart isolation regions are formed on the substrate which are substantially parallel to one another and extend in a first direction, with an active region between each pair of adjacent isolation regions. A plurality of spaced apart first trenches are formed across the active regions and isolation regions which are substantially parallel to one another and extend in a second direction that is substantially perpendicular to the first direction, each of the first trenches being substantially rectangularly shaped. A first layer of conductive material is formed in each of the active regions adjacent to the first trenches and disposed over a first layer of insulation material. A second layer of insulation material is formed in each of the active regions that is disposed adjacent to and over the first layer of conductive material. Each of the first trenches are filled with a second conductive material to form blocks of the second conductive material having a substantially rectangular shape, wherein for each of the active regions, each of the blocks is adjacent to the second layer of insulation material and is insulated from the substrate. A sidewall spacer of a conductive material is formed immediately adjacent to and contiguous with each of the blocks along the second direction, wherein for each active region each spacer is disposed over the second layer of insulation material and the first layer of conductive material. A plurality of first terminals are formed in the substrate, wherein in each of the active regions each of the first terminals is adjacent to one of the blocks. And, a plurality of second terminals are formed in the substrate, wherein in each of the active regions each of the second terminals is spaced apart from the first terminals and is below the first layer of conductive material.

In yet another aspect of the invention, an electrically programmable and erasable memory device includes a substrate of semiconductor material of a first conductivity type, first and second spaced-apart terminals in the substrate of a second conductivity type with a channel region therebetween, a first insulation layer disposed over the substrate, an electrically conductive floating gate disposed over the first insulation layer and extending over a portion of the channel region and over a portion of the second terminal, a second insulation layer disposed over and adjacent the floating gate and having a thickness permitting Fowler-Nordheim tunneling of charges therethrough, and an electrically conductive control gate having a first portion and a second portion. The first portion being substantially rectangularly shaped and positioned immediately adjacent to the second insulation layer. The second portion being substantially a spacer connected to the first portion and disposed over the floating gate and insulated therefrom.

In yet one more aspect of the present invention, an array of electrically programmable and erasable memory devices includes a substrate of semiconductor material of a first conductivity type, spaced apart isolation regions formed on the substrate which are substantially parallel to one another and extend in a first direction with an active region between each pair of adjacent isolation regions, and a plurality of electrically conductive control gates. Each of the active regions includes a column of memory cells extending in the first direction. Each of the memory cells includes first and second spaced-apart regions formed in the substrate having a second conductivity type with a channel region formed in the substrate therebetween, a first insulation layer disposed over said substrate including over said channel region, an electrically conductive floating gate disposed over said first insulation layer and extending over a portion of said channel region and over a portion of the second region, and a second insulation layer disposed over and adjacent the floating gate and having a thickness permitting Fowler-Nordheim tunneling of charges therethrough. The plurality of electrically conductive control gates each extending across the active regions and isolation regions in a second direction substantially perpendicular to the first direction and having a first portion that is substantially rectangular in shape and a second portion that is connected to the first portion and is substantially a spacer. Each of the control gates intercepts one of the memory cells in each of the active regions such that the first portion is positioned immediately adjacent to the second insulation layer therein and the second portion is disposed over the floating gate and insulated therefrom.

In yet a further aspect of the present invention, the present invention includes a self-aligned method of forming a semiconductor memory array of floating gate memory cells in a semiconductor substrate, each memory cell having a floating gate, a first terminal, a second terminal with a channel region therebetween, and a control gate. In the method of the present invention, a plurality of spaced apart isolation regions are formed on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material. A plurality of spaced apart first trenches are formed across the active regions and isolation regions which are substantially parallel to one another and extend in a second direction that is substantially perpendicular to the first direction, each of the first trenches exposing the first layer of the conductive material in each of the active regions. A second layer of insulation material is formed in each of the active regions that is disposed adjacent to and over the first layer of conductive material. Each of the first trenches are filled with a second conductive material to form blocks of the second conductive material each having a substantially planar sidewall portion, wherein for each of the active regions, each of the blocks is adjacent to the second layer of insulation material and is insulated from the substrate. A sidewall spacer of a conductive material is formed immediately adjacent to and contiguous with each of the substantially planar sidewall portions along the second direction, wherein for each active region each spacer is disposed over the second layer of insulation material and the first layer of conductive material. A plurality of first terminals are formed in the substrate, wherein in each of the active regions each of the first terminals is adjacent to one of the blocks. And, a plurality of second terminals are formed in the substrate, wherein in each of the active regions each of the second terminals is spaced apart from the first terminals and is below the first layer of conductive material.

In yet one more aspect of the present invention, a plurality of spaced apart isolation regions are formed on the substrate which are substantially parallel to one another and extend in a first direction, with an active region between each pair of adjacent isolation regions. A plurality of spaced apart first trenches are formed across the active regions and isolation regions which are substantially parallel to one another and extend in a second direction that is substantially perpendicular to the first direction. A first layer of conductive material is formed in each of the active regions adjacent to the first trenches and disposed over a first layer of insulation material. A second layer of insulation material is formed in each of the active regions that is disposed adjacent to and over the first layer of conductive material. Each of the first trenches are filled with a second conductive material to form blocks of the second conductive material each having a substantially planar sidewall portion, wherein for each of the active regions, each of the blocks is adjacent to the second layer of insulation material and is insulated from the substrate. A sidewall spacer of a conductive material is formed immediately adjacent to and contiguous with each of the substantially planar sidewall portions along the second direction, wherein for each active region each spacer is disposed over the second layer of insulation material and the first layer of conductive material. A plurality of first terminals are formed in the substrate, wherein in each of the active regions each of the first terminals is adjacent to one of the blocks. And, a plurality of second terminals are formed in the substrate, wherein in each of the active regions each of the second terminals is spaced apart from the first terminals and is below the first layer of conductive material.

In yet a further aspect of the invention, an electrically programmable and erasable memory device includes a substrate of semiconductor material of a first conductivity type, first and second spaced-apart terminals in the substrate of a second conductivity type with a channel region therebetween, a first insulation layer disposed over the substrate, an electrically conductive floating gate disposed over the first insulation layer and extending over a portion of the channel region and over a portion of the second terminal, a second insulation layer disposed over and adjacent the floating gate and having a thickness permitting Fowler-Nordheim tunneling of charges therethrough, and an electrically conductive control gate having a first portion and a second portion. The first portion having a substantially planar sidewall portion and is positioned immediately adjacent to the second insulation layer. The second portion being substantially a spacer connected to the substantially planar sidewall portion and disposed over the floating gate and insulated therefrom.

In yet one more aspect of the present invention, an array of electrically programmable and erasable memory devices includes a substrate of semiconductor material of a first conductivity type, spaced apart isolation regions formed on the substrate which are substantially parallel to one another and extend in a first direction with an active region between each pair of adjacent isolation regions, and a plurality of electrically conductive control gates. Each of the active regions includes a column of memory cells extending in the first direction. Each of the memory cells includes first and second spaced-apart terminals formed in the substrate having a second conductivity type with a channel region formed in the substrate therebetween, a first insulation layer disposed over said substrate including over said channel region, an electrically conductive floating gate disposed over said first insulation layer and extending over a portion of said channel region and over a portion of the second terminal, and a second insulation layer disposed over and adjacent the floating gate and having a thickness permitting Fowler-Nordheim tunneling of charges therethrough. The plurality of electrically conductive control gates each extending across the active regions and isolation regions in a second direction substantially perpendicular to the first direction and having a first portion that has a substantially planar sidewall portion and a second portion that is connected to the substantially planar sidewall portion and is substantially a spacer. Each of the control gates intercepts one of the memory cells in each of the active regions such that the first portion is positioned immediately adjacent to the second insulation layer therein and the second portion is disposed over the floating gate and insulated therefrom.

Other objects and features of the present invention will become apparent by a review of the specification, claims and appended figures.

DETAILED DESCRIPTION OF THE PREFERRED EMBODIMENTS

Figure 1A:
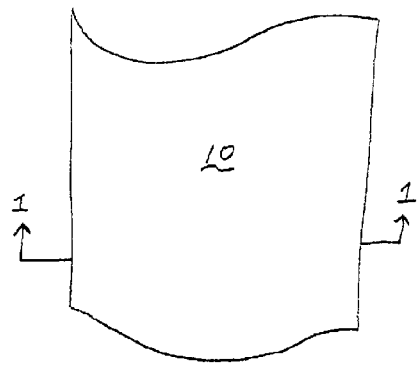
FIG. 1A is a top view of a semiconductor substrate used in the first step of the method of present invention to form isolation regions.
Figure 1B:
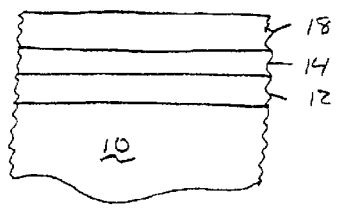
FIG. 1B is a cross sectional view taken along the line 1—1.

Referring to FIG. 1A there is shown a top plan view of a semiconductor substrate 10, which is preferably of P type and is well known in the art. A first layer of insulation material 12, such as silicon dioxide (oxide), is deposited thereon as shown in FIG. 1B. The first insulation layer 12 is formed on the substrate 10 by well known techniques such as oxidation or deposition (e.g. chemical vapor deposition or CVD), forming a layer of silicon dioxide (hereinafter "oxide"). A first layer of polysilicon 14 (FG poly) is deposited on top of the first layer of insulation material 12. The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD. This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 1C:
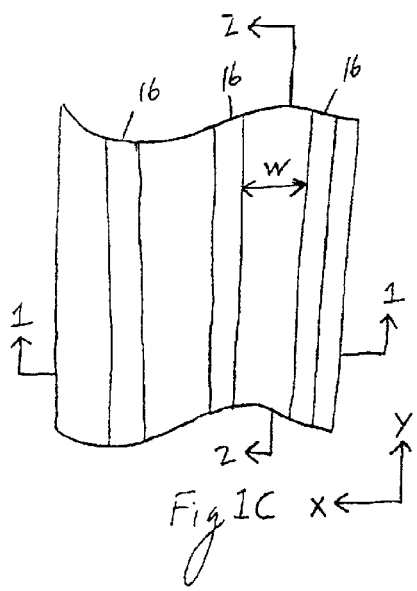
FIG. 1C is a top view of the next step in the processing of the structure of FIG. 1B, in which isolation regions are formed.
Figure 1D:
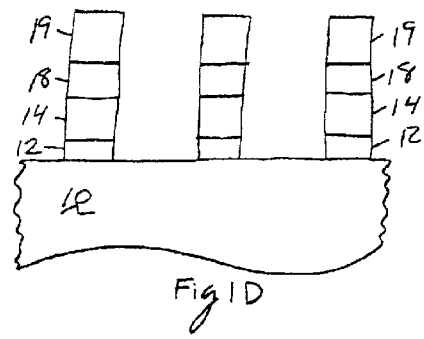
FIG. 1D is a cross sectional view of the structure in FIG. 1C taken along the line 1—1 showing the isolation stripes formed in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y direction or the column direction, as shown in FIG. 1C, using standard etching techniques (i.e. anisotropic etch process). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 1D. As will be described, there are two embodiments in the formation of the isolation regions: LOCOS and STI. In the STI embodiment, the etching continues into the substrate 10.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 1E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of local field oxide 20a.

Figure 1E:
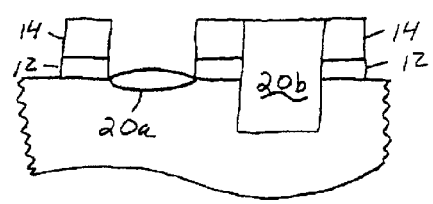
FIG. 1E is a cross sectional view of the structure in FIG. 1C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 1E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 1E represents a self aligned structure, which is more compact than a structure formed by a non self-aligned method. A non self-aligned method of forming the structure shown in FIG. 1E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

Figure 2A:
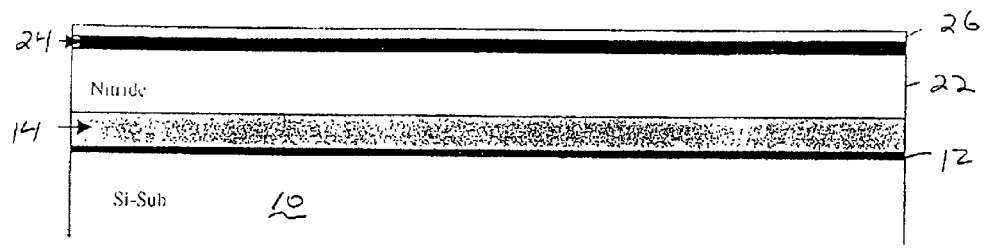
FIGS. 2A–2L are cross sectional views taken along the line 2—2 of FIG. 1C showing in sequence the next step(s) in the processing of the structure shown in FIG. 1C, in the formation of a non volatile memory array of floating memory cells of the split gate type.

With the structure shown in FIG. 1E made using either the self aligned method or the non self-aligned method, the structure is further processed as follows. Referring to FIG. 2A, which shows the structure from a view orthogonal to that of FIGS. 1B and 1E, the next steps in the process of the present invention are illustrated. Three insulation layers are formed on the structure. Specifically, a thick silicon nitride layer 22 is deposited across the entire surface of the structure, followed by the deposition of a pad oxide layer 24 (SiO2). Silicon nitride layer 22 is approximately 2000–3000 A thick, and pad oxide layer 24 is approximately 200–400 A thick. A top nitride layer 26 approximately 800 A thick is then deposited onto oxide layer 24.

Figure 2B:
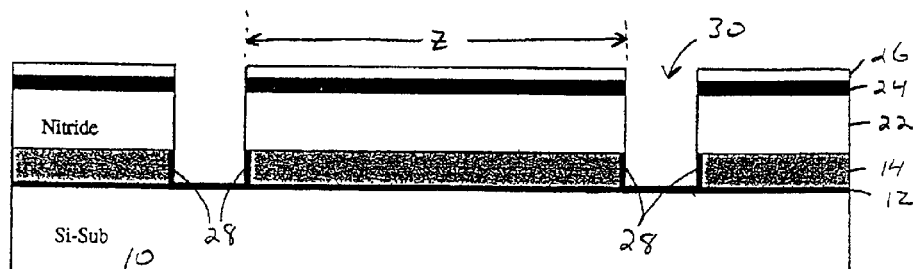

A WL masking operation is performed with photo-resist applied on top of the silicon nitride 26. A masking step is applied in which stripes (i.e. masking regions) are defined in the X or the row direction. The distance Z between adjacent stripes can be a size determined by the needs of the device to be fabricated. The proposed structure can contain three "features", i.e. two gates and one "space" within the distance Z. The photo resist is removed in defined masking regions, i.e. stripes in the row direction, after which well known etch processes are used to selectively remove layers 26, 24, 22 and 14 underlying the removed photo resist in the stripes. Specifically, a nitride anisotropic etch process is used to remove the exposed portion of the silicon nitride layer 26 until the pad oxide layer 24 is observed, which acts as an etch stop thereby stopping the etch process. Then, an anisotropic oxide etch step is performed to remove the exposed pad oxide layer 24 until the nitride layer 22 is observed, which acts as an etch stop. Then another nitride anisotropic etch process is used to remove the exposed portion of the silicon nitride layer 22 until the polysilicon layer 14 is observed, which acts as an etch stop thereby stopping the etch process. An anisotropic polysilicon etch process follows to remove the exposed portion of the polysilicon layer (FG poly) 14 until the insulation layer 12 is observed, which acts as an etch stop. These four etch processes result in the formation of first trenches 30, spaced apart by a distance Z, that extend down to insulation layer 12. Finally, the sides of polysilicon layer 14 that are exposed inside first trenches 30 are oxidized in an oxidation step to form FG oxide sidewalls 28, and the remaining photo-resist is removed. The resulting structure is shown in FIG. 2B.

Figure 2C:
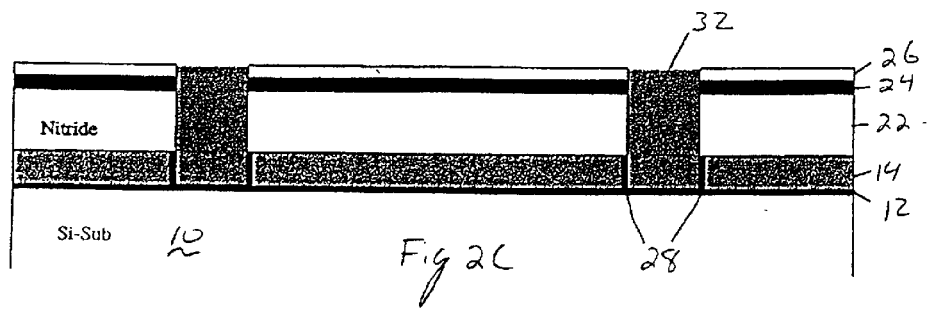

A polysilicon deposition step is then performed, which fills the first trenches 30 with a block 32 of polysilicon. Excess polysilicon deposited outside first trenches 30 is etched away, preferably in a CMP etch back process, leaving the top of polysilicon blocks 32 substantially even with the top nitride layer 26, as illustrated in FIG. 2C. Blocks 32 are substantially rectangular in shape.

Figure 2D:
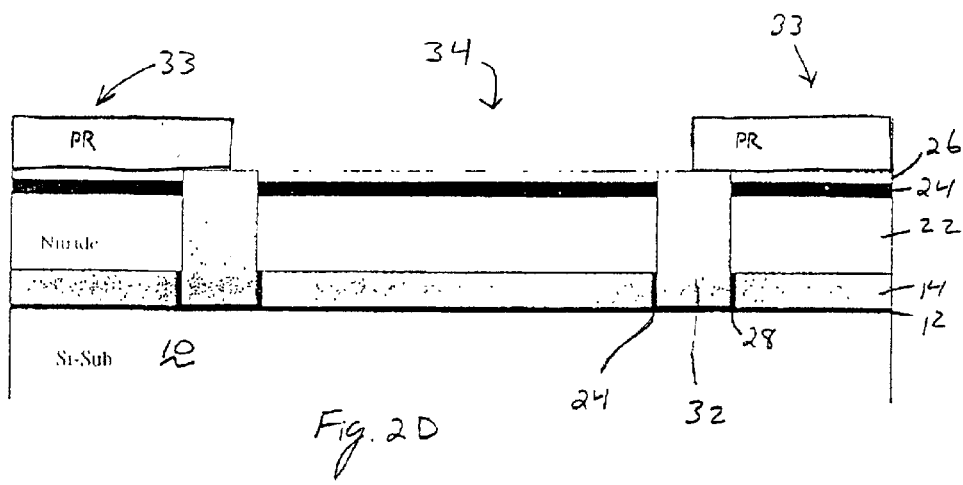

Referring now to FIG. 2D, a nitride etch mask photo-resist PR (a hard mask could alternatively be used) is placed over the structure to cover alternate intermediate regions 33 (that eventually form the space between adjacent mirror sets of memory cells), leaving alternate intermediate regions 34 exposed, and thereby effectively selecting pairs of blocks 32 that will be associated together in matching mirror sets of memory cells. The alternate intermediate regions 33 will eventually serve as isolation and bit line connection for the pairs of matching memory cells. It should be noted that the precise location of the photo-resist mask PR is not critical, so long as the edges thereof are located somewhere over the blocks 32. A nitride etch process (wet or dry) is performed, followed by an oxide etch process, and another nitride etch process, to etch away nitride layer 26, pad oxide layer 24, and nitride layer 22 inside the exposed alternate intermediate regions 34. Because the etchant is a selective etchant, the blocks 32 of polysilicon and the FG poly layer 14 are unaffected, leaving second trenches 35 with the FG poly layer 14 exposed at the bottom thereof. For each etch process, the underlying layer acts as an etch stop, and the PR mask prevents any etching in the alternate intermediate regions 33. The etch mask PR is then stripped away.

Figure 2E:
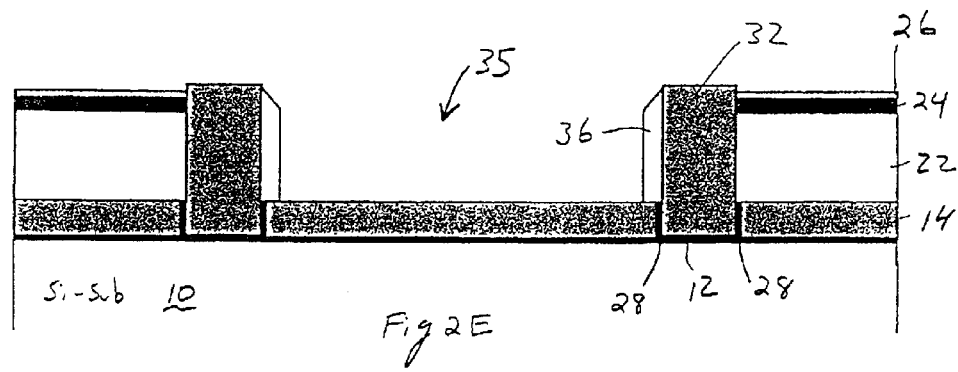

Nitride spacers 36 are then formed along the surfaces of poly block 32 that face second trenches 35. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. Thus, nitride spacer 36 formation is accomplished by depositing a thin layer of nitride on exposed surfaces of the structure, followed by an anisotropic etch process, such as Reactive Ion Etch (RIE) which is well known in the art, until the nitride layer no longer covers FG poly layer 14. In the process, some silicon nitride 26 atop the silicon oxide 24 may also be etched leaving the blocks 32 protruding above the plane of the nitride 26. The resulting structure is illustrated in FIG. 2E.

Figure 2F:
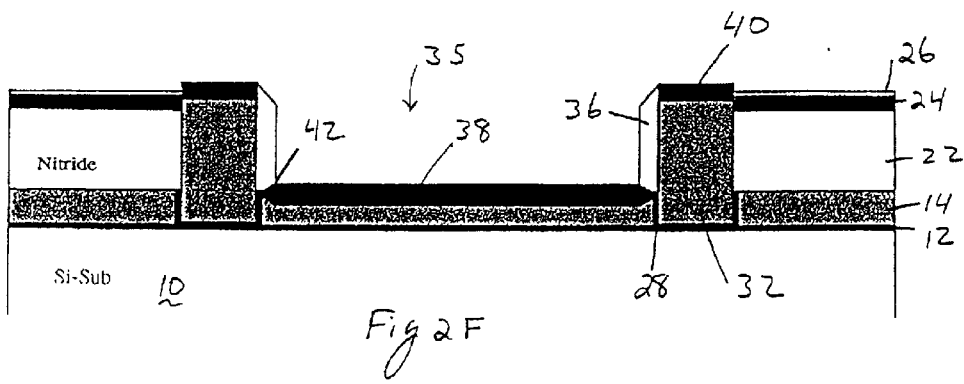

The next step is an oxidation process, which oxidizes the exposed polysilicon surfaces (i.e. polysilicon layer 14 inside of second trench 35, and polysilicon block 32) to form an oxide layer 38 over polysilicon layer 14 and another oxide layer 40 over polysilicon blocks 32, as illustrated in FIG. 2F. This oxidation step results in oxide layer 38 being formed in a lens shape with side edges thereof joining with FG side oxide walls 28 to form an insulation layer that is disposed adjacent and over the polysilicon layer 14, and in the formation of upwardly projecting sharp edges 42 at each side edge of polysilicon layer 14 located inside second trenches 35. The sharp edges 42 and the thickness of the insulation layer formed by layers 28/38 permit Fowler-Nordheim tunneling of the charges therethrough. While not shown, an optional poly etch process can be performed before the formation of oxide layer 38. This optional customized anisotropic poly etch process etches away a portion of the top surface of poly layer 14, but leaves a taper shape in that top surface in the area next to poly blocks 32, which helps start the formation of sharp edges 42.

Figure 2G:
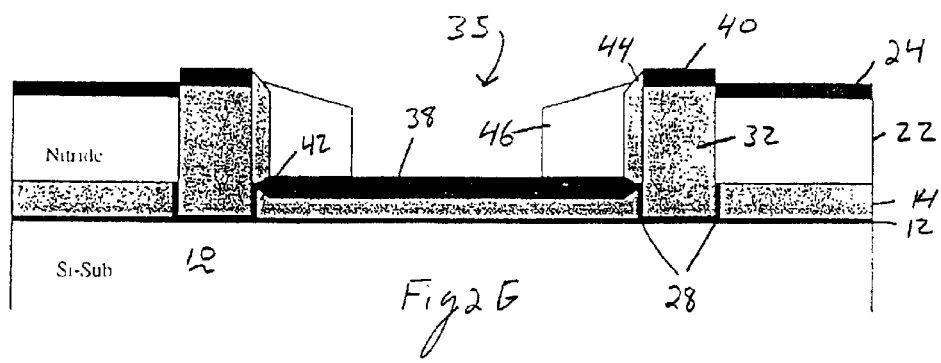

The nitride spacers 36 and nitride layer 26 are then stripped away, preferably using a wet etch process (or other isotropic etch process). WL thin polysilicon spacers 44 are then added, as illustrated in FIG. 2G. The WL thin poly spacers 44 are formed by first depositing a thin layer of polysilicon, followed by an anisotropic etch process (e.g. RIE), which removes all of the thin layers of polysilicon except for WL thin poly spacers 44. The poly blocks 32 and WL thin poly spacers 44 form the control gates (described later) having notches that face the corresponding sharp edges 42, but are insulated therefrom by FG oxide sidewalls 28 and oxide layer 38. Thick insulation inner sidewall spacers 46 are then formed over part of oxide layer 38 and up against WL thin poly spacers 44. Thick inner sidewall spacers 46 can be formed either of an oxide by an oxide deposition step, or of nitride using a nitride deposition step, followed by an anisotropic etch process (e.g. RIE). The structure illustrated in FIG. 2G is formed by using the nitride deposition and etch processes, which also results in the removal of any remaining nitride in top layer 26.

An anisotropic etch process is then performed to remove the exposed portions of oxide layers 24, 38 and 40. A poly etch process follows, which removes the portion of the polysilicon layer 14 that is exposed between the spacers 46 at the bottom of second trenches 35. An oxide etch step is then performed, which removes the exposed portion of insulation layer 12 at the bottom of second trench 35, until the substrate 10 is observed. An oxidation process is then performed, which oxidizes the side surface of layer 14 that is exposed in second trench 35 to form an oxide region 47. This same region can also be formed through an oxide deposition and RIE etch process, as described below with reference to FIGS. 5A–5F. The oxidation process here also forms an oxide layer 48 on the top surface of the poly block 32, and re-forms the oxidized layer 12 along the surface of substrate 10 at the bottom of second trench 35. Suitable ion implantation is then made across the entire surface of the structure. Where the ions have sufficient energy to penetrate the first silicon dioxide layer 12, they then form a first region (i.e. a second terminal) 50 in the substrate 10. In all other regions, the ions are absorbed by the nitride layer 22, oxide layer 48, poly block 32 and nitride sidewall spacers 46, where they have no effect. Then, inner spacers 52 are formed on the sides of the second trenches 35 by deposition of nitride, followed by an anisotropic nitride etch process (e.g. RIE) to remove the nitride from all surfaces except the side walls of second trench 35. While nitride is illustrated, other types of materials, such as oxide, can be used to form spacers 52. The resulting structure is illustrated in FIG. 2H.

Figure 2H:
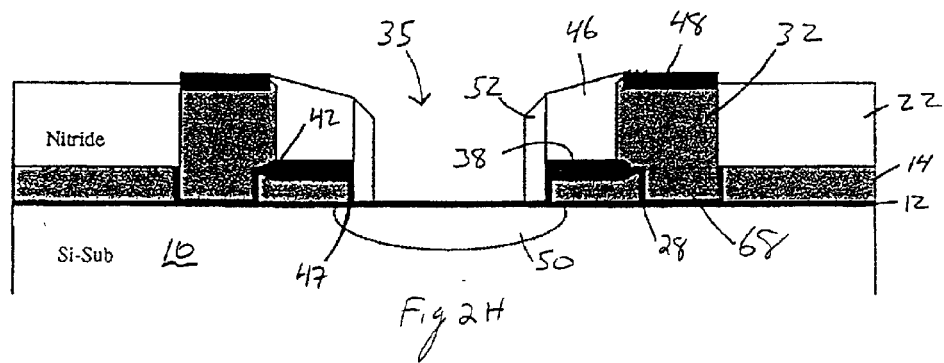
Figure 2I:
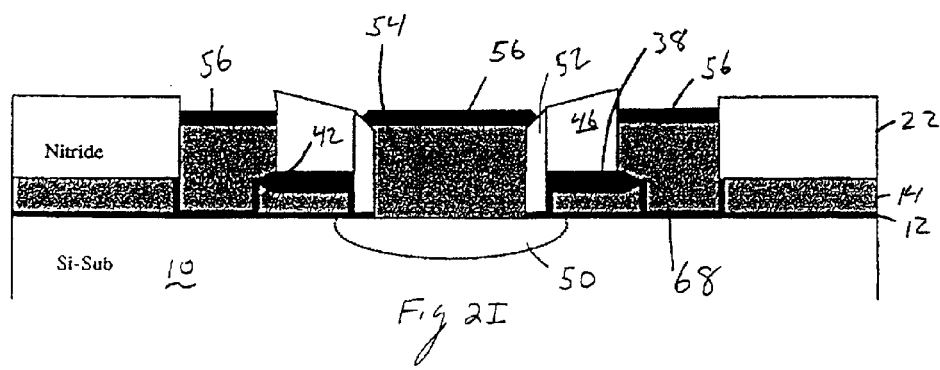

An oxide etch process is performed on the structure of FIG. 2H, which removes exposed oxide layers 48 down to poly block 32 which forms an etch stop, and oxide layer 12 in second trenches 35 down to the silicon substrate 10 which forms an etch stop. A polysilicon deposition step is then performed, which fills the second trenches 35 with a block 54 of polysilicon. The polysilicon is properly doped either through an in-situ method or by conventional implantation. Excess polysilicon deposited outside the second trenches 35 is etched away, preferably in a CMP etch back process, leaving the top of polysilicon blocks 54 even with the top of poly blocks 32, as illustrated in FIG. 2I. An oxidation step is then performed to oxidize the top surfaces of poly block 54 and poly blocks 32, thus forming oxide layer 56. The resulting structure is illustrated in FIG. 2I.

Figure 2J:
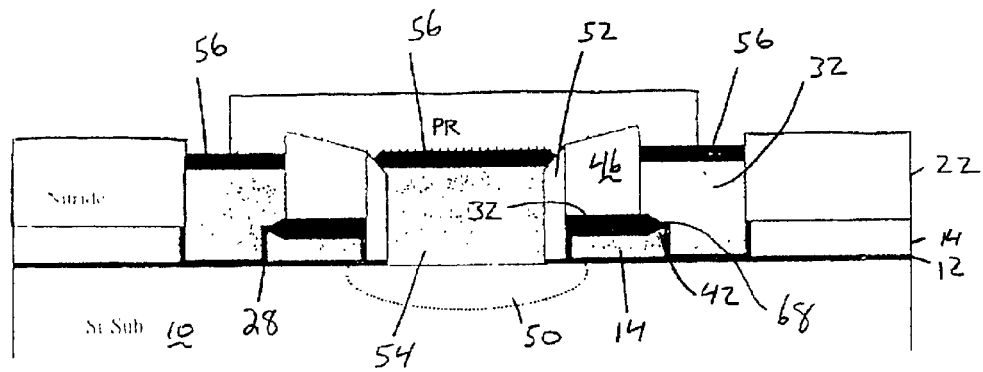
Figure 2K:
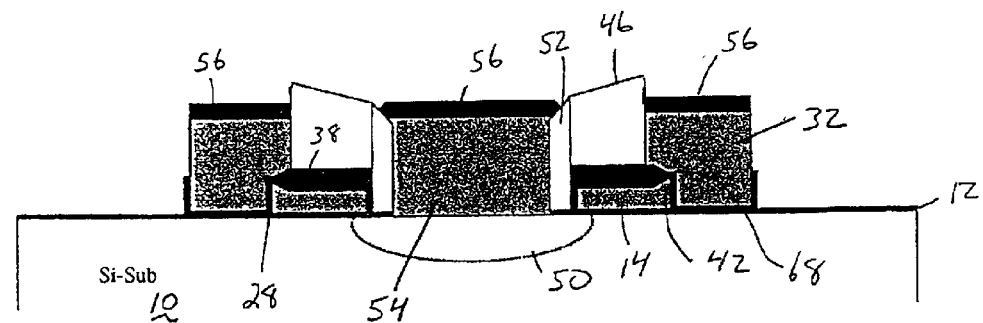

A nitride photo-resist etch mask PR is placed over the structure, covering at least the nitride sidewall spacers 46, but leaving exposed the remaining portions of the nitride layer 22, as illustrated in FIG. 2J. Then, a nitride etch process is used to remove the remaining portions of the nitride layer 22 to expose polysilicon layer 14 (outside of second trench 35), which acts as the etch stop. A poly etch process follows to remove the remaining portions of polysilicon layer 14 outside of the pairs of poly blocks 32. The etch mask PR is then removed, leaving the structure shown in FIG. 2K.

Figure 2L:
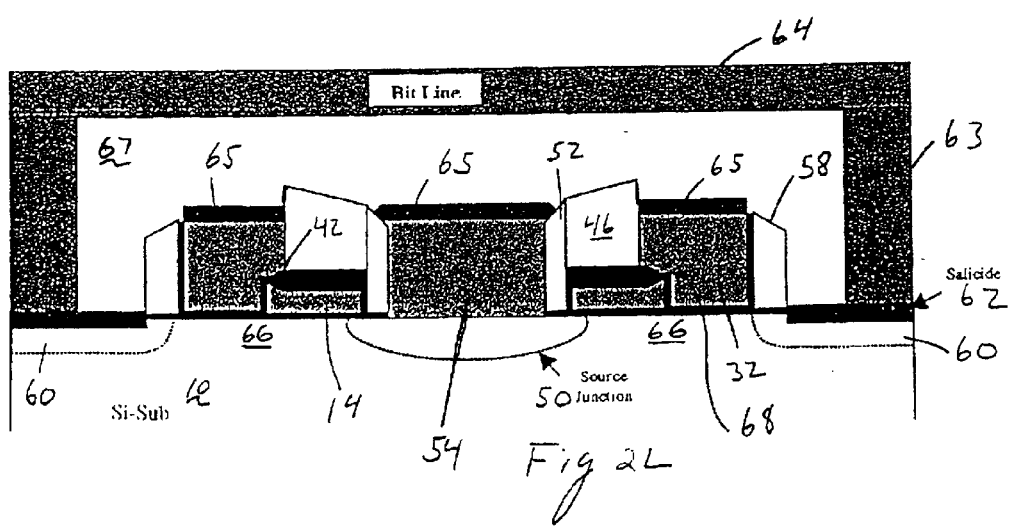

To complete the memory cells, nitride side wall spacers 58 are formed next to poly blocks 32 by first forming a layer of oxide by thermal oxidation or by CVD to cover/encapsulate the poly block 32, which is followed by depositing a layer of nitride over the structure, and performing an anisotropic nitride etch. Ion implantation (e.g. N+) is then used to form second regions (i.e. first terminals) 60 in the substrate in the same manner as the first regions 50 were formed. An oxide etch follows to remove layer 12 next to spacers 58 and exposed on the substrate 10, and oxide layer 56. A metal deposition step is then formed, using a conductive metal such as tungsten, cobalt, titanium, nickel, platinum or molybdenum. The structure is annealed, permitting the hot metal to flow and seep into the exposed top portions of the substrate 10 to form metalized silicon regions 62, and into the exposed top portions of poly blocks 32/54 to form metalized silicon regions 65 (which facilitates conduction in the row direction). Metalized silicon region 62 on substrate 10 can be called self aligned silicide (i.e. salicide), because it is self aligned to the second regions 60 by spacers 58. Metalized silicon region 65 on poly blocks 32/54 is commonly called polycide. The metal deposited on the remaining structure is removed by a metal etch process. Passivation, such as BPSG 67, is used to cover the entire structure. A masking step is performed to define etching areas over the salicide regions 62. The BPSG 67 is selectively etched in the masked regions down to the salicide regions 62, and the resulting trenches are filled with a conductor metal 63 by metal deposition and planarization etch-back. The salicide layers 62 facilitate conduction between the conductor 63 and second regions 60. A bit line 64 is added by metal masking over the BPSG 67, to connect together all the conductors 63 in the column of memory cells. The final memory cell structure is illustrated in FIG. 2L. First and second regions 50/60 form the source and drain for each cell (those skilled in the art know that source and drain can be switched during operation). The channel region 66 for each cell is the portion of the substrate that is in-between the source and drain 50/60. Poly blocks 32 and poly spacers 44 constitute the control gate, and poly layer 14 constitutes the floating gate. The control gate 32 has one side aligned to the edge of the second region 60, and is disposed over part of the channel region 66. A notch 68 is formed in the corner of the control gate 32/44 (where poly block 32 is attached to poly spacer 44) which partially extends over the floating gate 14 (sharp edge 42 of floating gate 14 extends into the notch 68). Floating gate 14 is over part of the channel region 66, is partially overlapped at one end by the control gate 32/44, and partially overlaps the first region 50 with its other end. As illustrated in the FIG. 2L, the process of the present invention forms pairs of memory cells that mirror each other. The mirrored memory cells are insulated from each other by nitride inner spacers 52 and the oxide layer at the end of the ends of the floating gates 14.

Figure 2M:
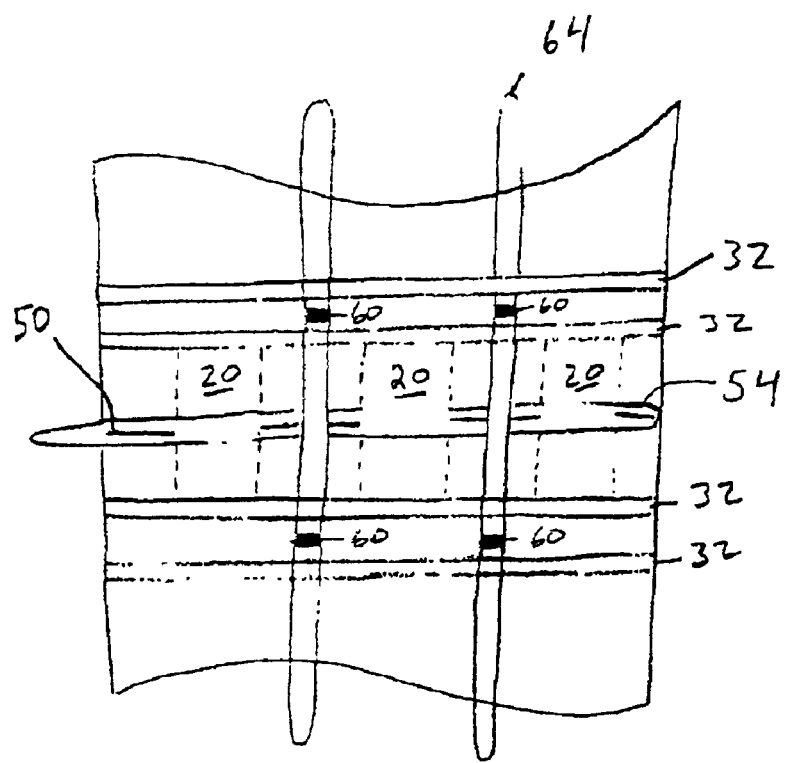
FIG. 2M is a top view showing the interconnection of row lines and bit lines to terminals in active regions in the formation of the non volatile memory array of floating memory cells of the split gate type.

Referring to FIG. 2M, there is shown a top plan view of the resulting structure and the interconnection of the bit lines 64 to the second regions 60 and of the control lines 32 which run in the X or the row direction and finally the source lines 54 which connect to the first regions 50 within the substrate 10. Although the source lines 54 (as should be understood by those skilled in the art, the word "source" is interchangeable with the word "drain") make contact with the substrate 10 in the entire row direction, i.e. contact with the active regions as well as the isolation regions, the source lines 54 electrically connect only to the first regions 50 in the substrate 10. In addition, each first region 50 to which the "source" line 54 is connected is shared between two adjacent memory cells. Similarly, each second region 60 to which the bit line 64 is connected is shared between adjacent memory cells from different mirror sets of memory cells.

The result is a plurality of non volatile memory cells of the split gate type having a floating gate 14, a control gate 32 which is a spacer immediately adjacent to but separated from the floating gate and connected to a substantially rectangularly shaped structure which runs along the length of the row direction connecting to the control gates of other memory cells in the same row, a source line 54 which also runs along the row direction, connecting the first regions 50 of pairs of memory cells in the same row direction, and a bit line 64 which runs along the column or Y direction, connecting the second regions 60 of the memory cells in the same column direction. The formation of the control gate, the floating gate, the source line, and the bit line, are all self-aligned. The non-volatile memory cell is of the split gate type having floating gate to control gate tunneling all as described in U.S. Pat. No. 5,572,054, whose disclosure is incorporated herein by reference with regard to the operation of such a non-volatile memory cell and an array formed thereby.

FIGS. 3A–3D illustrate an alternate process for forming the structure illustrated in FIG. 2B. The preferred embodiment described above uses a litho resolution process to form the first trenches 30 in layers 26, 24, 22 and 14. However, a sub-litho process could instead be used starting from the structure illustrated in FIG. 2A to define first trenches 30 having a width that is smaller than originally defined by the masking step. Starting from the structure illustrated in FIG. 2A, two additional layers 70 and 72 are formed or deposited on nitride layer 26. In the embodiment shown in FIG. 3A, layer 70 is a polysilicon layer, and layer 72 is an oxide layer. Next, the WL masking operation is performed with photoresist applied on top of oxide layer 72. The masking step in which stripes are defined in the X or the row direction is applied. The photo resist is removed in defined selective regions, i.e. stripes in the row direction, after which an oxide etch process is followed by a poly etch process to selectively remove oxide layer 72 and poly layer 70 in the exposed stripes to define first trenches 30. A WL photo strip step follows which removes the photo-resist. Spacers 76 are then formed on the sides of first trenches 30. Spacers 76 are formed of either oxide or polysilicon. In the embodiment shown in FIG. 3B, spacers 76 are formed of polysilicon by a conventional deposition process, whereby a layer of polysilicon is deposited on the structure, and reactive ion etching is used to remove the polysilicon except for the spacers 76. Finally, a nitride etch is performed between spacers 76 to remove the nitride layer 26 at the bottom of the first trenches 30, resulting in the structure illustrated in FIG. 3B.

Figure 3A:
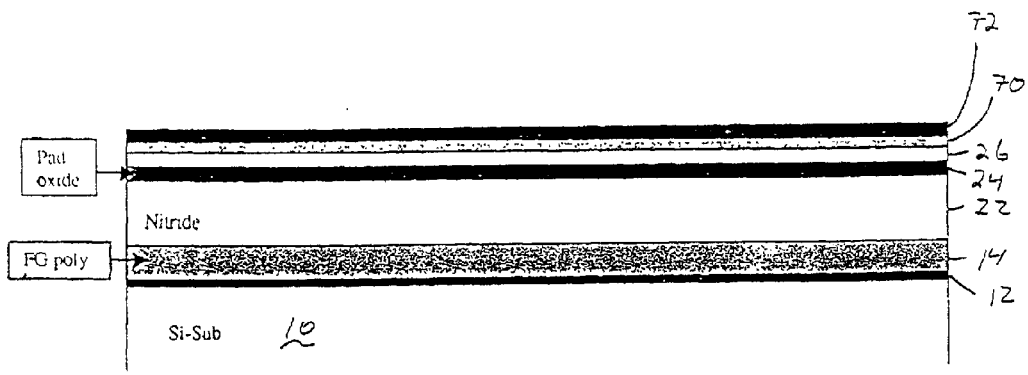
FIGS. 3A–3D are cross sectional views taken along the line 2—2 illustrating in sequence the steps in a first alternate processing of the structure shown in FIG. 2A to form the structure shown in FIG. 2B.
Figure 3B:
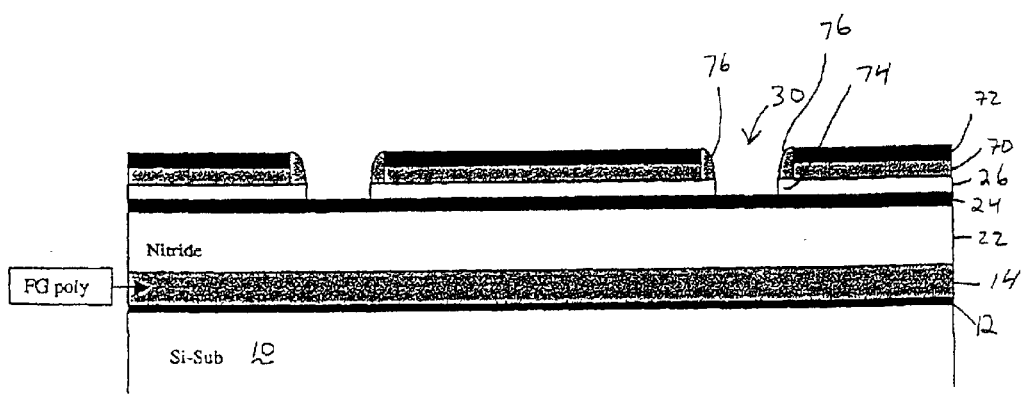
Figure 3C:
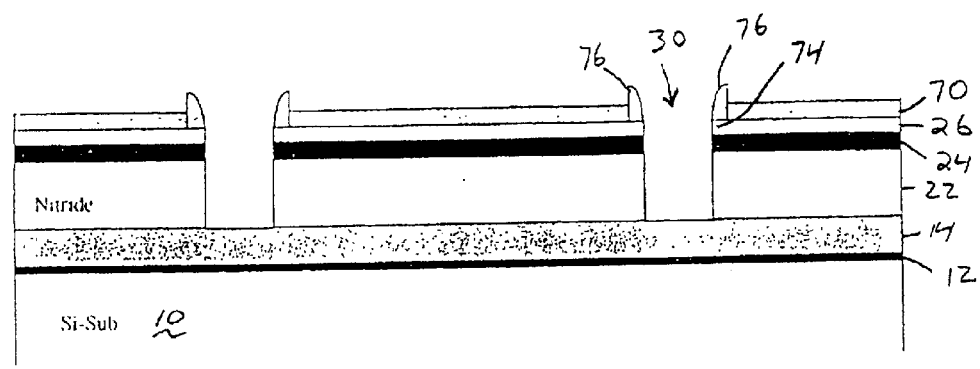
Figure 3D:
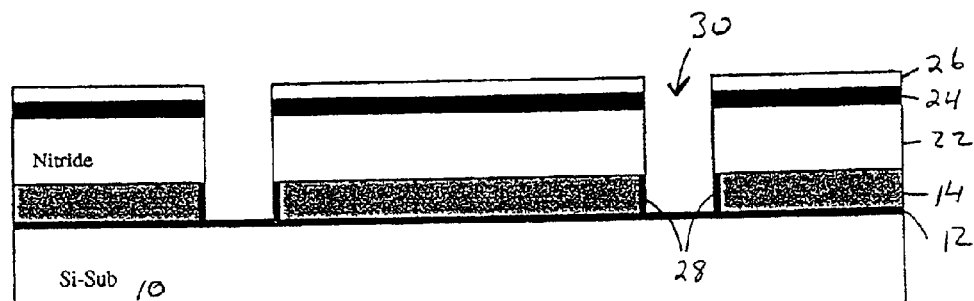

Next, an RIE oxide etch step is performed to remove oxide layer 72, and the exposed portions of oxide layer 24 at the bottom of first trenches 30 until the nitride layer 22 is observed. Then, a thick nitride RIE etch step is performed to remove the exposed portion of nitride layer 22 inside first trenches 30 until poly layer 14 is observed, as shown in FIG. 3C. A poly RIE etch follows, which removes poly layer 70, spacers 76, and exposed portions of poly layer 14 at the bottom of first trenches 30 until oxide layer 12 is observed. Finally, an oxidation step is performed to oxidize the sides of polysilicon layer 14 that are exposed inside first trenches 30 to form FG oxide sidewalls 28. The resulting structure is shown in FIG. 3D, which is identical to the structure illustrated in FIG. 2B, but with a smaller width for first trench 30. The use of spacers 76 allows the formation of first trenches 30 having a width that is less than the width of the masking step used to initially define the top of first trench 30, which is why the process is referred to as a sub-litho process.

Figure 4A:
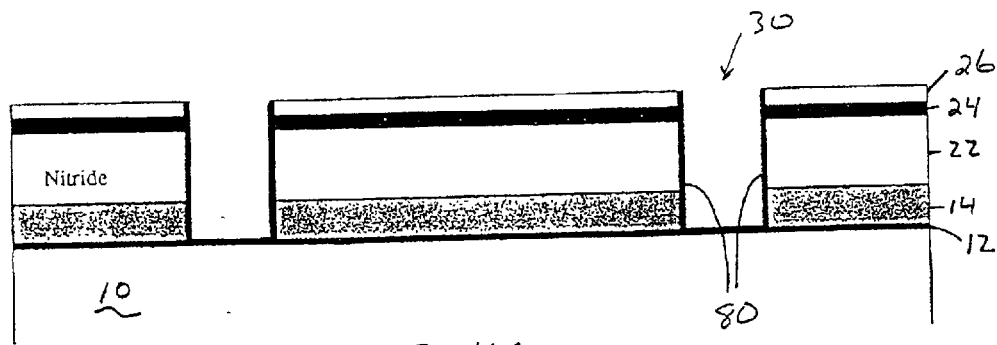
FIGS. 4A–4E are cross sectional views taken along the line 2—2 illustrating in sequence the steps in a second alternate processing of the structure shown in FIG. 2A to form the structure shown in FIG. 2F.
Figure 4B:
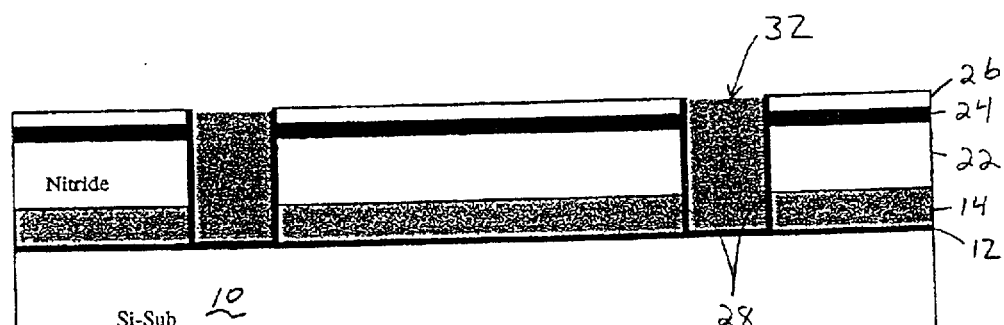
Figure 4C:
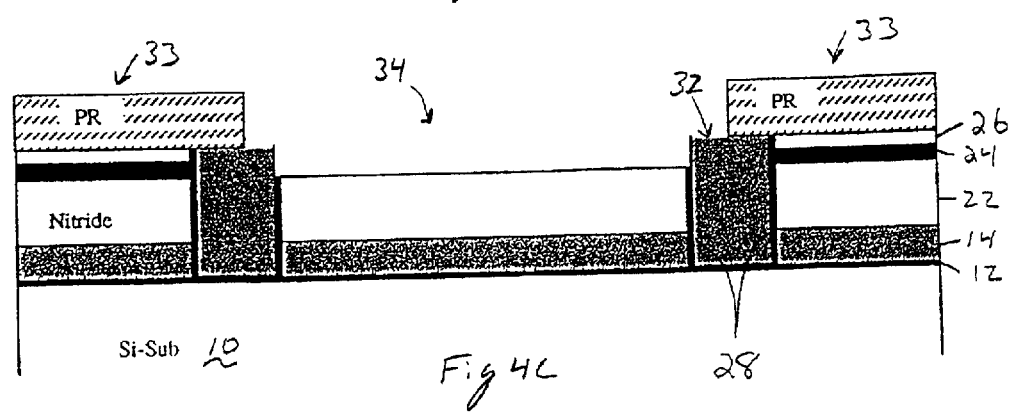
Figure 4D:
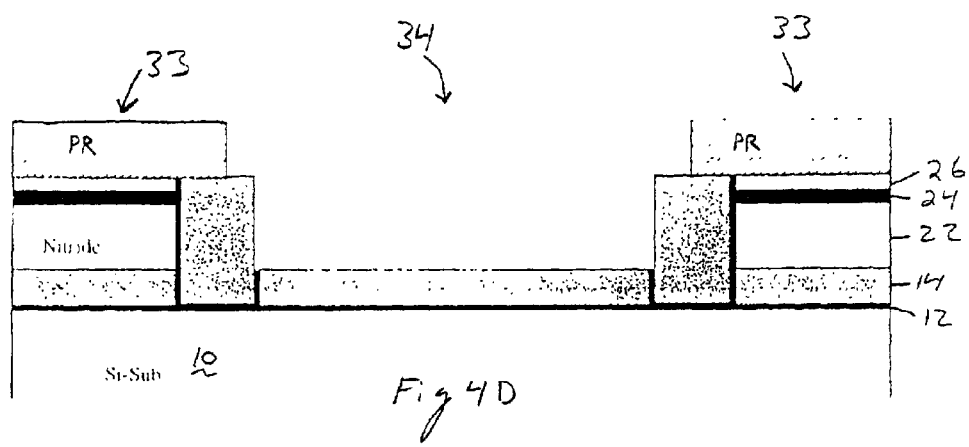
Figure 4E:
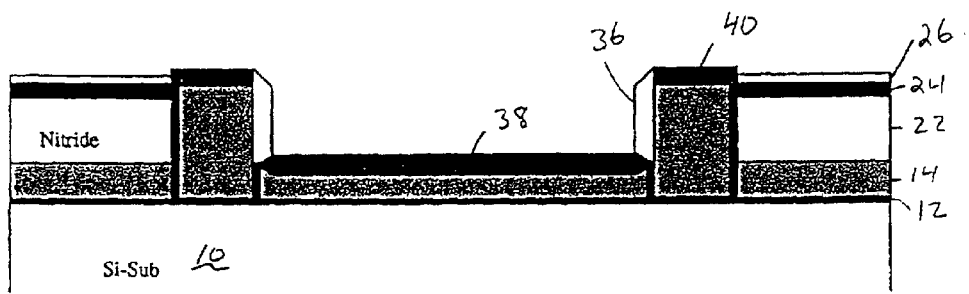

FIGS. 4A to 4E illustrate an alternate process for forming the structure illustrated in FIG. 2F, except with the addition of an oxide layer lining the outer side of poly block 32 (as shown in FIG. 4E). In the preferred embodiment described above, the last step performed to result in the structure shown in FIG. 2B is an oxidation step. Starting before that oxidation step, the following alternate process can be utilized to replace those steps described above with regard to FIGS. 2C–2F. Instead of the oxidation step that forms oxide sidewalls 28, an HTO oxide deposition is performed to form oxide sidewalls 80 extending along the height of the sidewalls of first trenches 30, as illustrated in FIG. 4A. A polysilicon deposition step is then performed, which fills the first trenches 30 with a block 32 of polysilicon. Excess polysilicon deposited outside first trenches 30 is etched away, preferably in a CMP etch back process, leaving the top of polysilicon blocks 32 substantially even with the top nitride layer 26, as illustrated in FIG. 4B.

Referring now to FIG. 4C, a nitride etch mask PR (a hard mask could alternatively be used) is placed over the structure to cover alternate intermediate regions 33 (that eventually form the space between adjacent mirror sets of memory cells), leaving alternate regions 34 exposed, and thereby effectively selecting pairs of blocks 32 that will be associated together in matching mirror sets of memory cells. The alternate intermediate regions 33 will eventually serve as isolation and bit line connection for pairs of selected matching memory cells. Then, a nitride etch process (wet or dry) is performed, followed by an oxide etch process to etch away nitride layer 26 and pad oxide layer 24 inside the exposed alternate intermediate regions 34, leaving second trenches 35 with the nitride layer 22 exposed at the bottom thereof. For each etch process, the underlying layer acts as an etch stop, and the PR mask prevents any etching in the alternate intermediate regions 33. The resulting structure is illustrated in FIG. 4C.

Next, a thick nitride etch process is performed to etch away the exposed nitride layer 22 from the bottom of second trenches 35 until the poly layer 14 is observed, as illustrated in FIG. 4D. The etch mask PR is then stripped away. Nitride spacers 36 are then formed along the surfaces of poly block 32 that face second trenches 35. Nitride spacer 36 formation is accomplished by depositing a thin layer of nitride on exposed surfaces of the structure, followed by an anisotropic etch process, such as Reactive Ion Etch (RIE) which is well known in the art, until the nitride layer no longer covers FG poly layer 14. The next step is an oxidation process, which oxidizes the exposed polysilicon surfaces (i.e. polysilicon layer 14 inside of second trench 35, and polysilicon block 32) to form an oxide layer 38 over polysilicon layer 14 and another oxide layer 40 over polysilicon block 32, as illustrated in FIG. 4E. This oxidation step results in oxide layer 38 being formed in a lens shape with side edges thereof joining with FG side oxide walls 28, and in the formation of upwardly projecting sharp edges 42 at each side edge of polysilicon layer 14 located inside second trenches 35. The sharp edges 42 and the thickness of the insulation layer formed by layers 28/38 permit Fowler-Nordheim tunneling of the charges therethrough. While not shown, an optional poly etch process can be performed before the formation of oxide layer 38. This optional customized anisotropic poly etch process etches away a portion of the top surface of poly layer 14, but leaves a taper shape in that top surface in the area next to poly blocks 32, which helps start the formation of sharp edges 42. The remaining process steps from the preferred embodiment starting with those discussed after FIG. 2F can then be performed to finish the formation of the final structure.

Figure 5A:
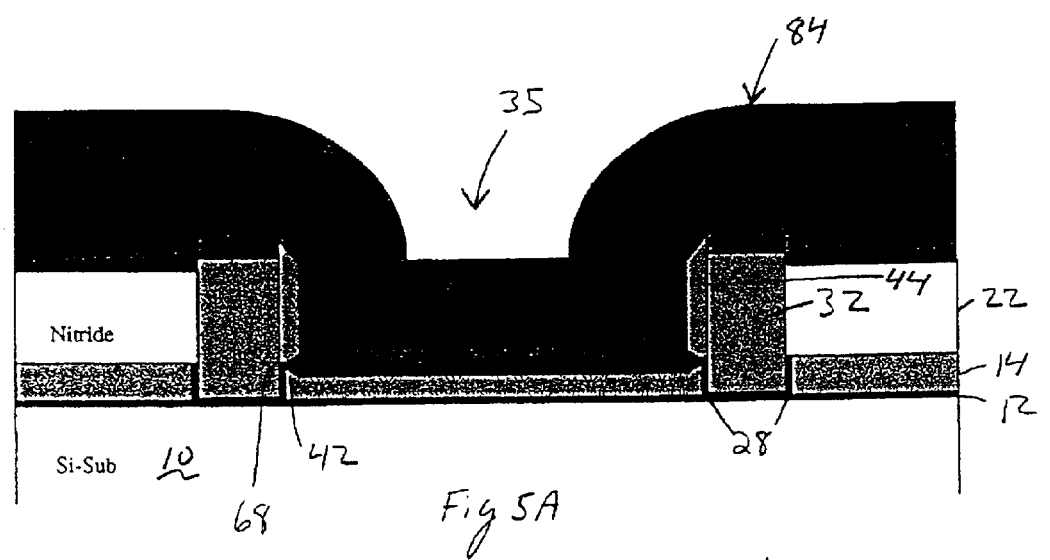
FIGS. 5A–5F are cross sectional views taken along the line 2—2 illustrating in sequence the steps in a third alternate processing of the structure shown in FIG. 2F to form oxide spacers adjacent to the control gate and atop the floating gate.
Figure 5B:
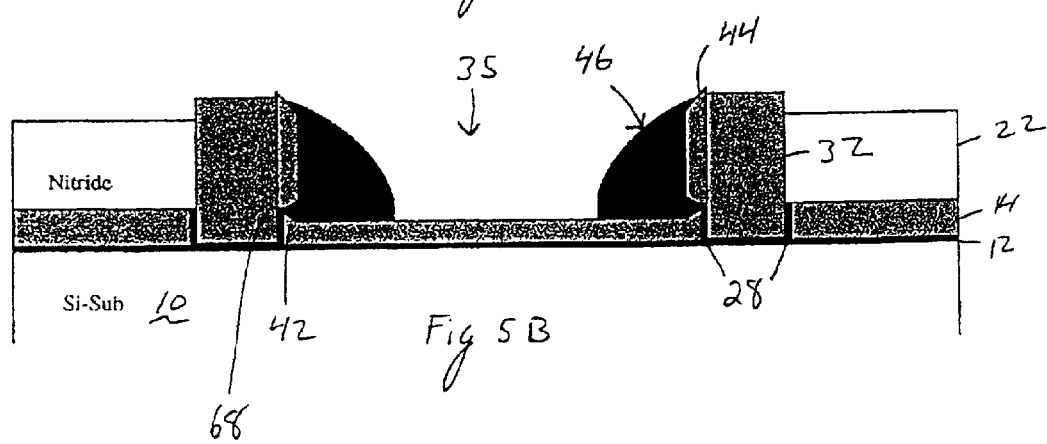

FIGS. 5A–5F show an alternate process for forming the memory cells with spacers 46, adjacent to the control gate spacer 44 and on the floating gate 14, made of oxide instead of nitride. In the preferred embodiment shown in FIG. 2G, spacers 46 are formed by depositing a thick nitride layer over the structure, followed by an anisotropic nitride etch step. However, spacers 46 can be formed of oxide using the following steps. After thin poly spacers 44 are formed (see FIG. 2G), a thick oxide layer 84 is deposited on the structure, as illustrated in FIG. 5A. An anisotropic etch process (e.g. RIE) follows which removes oxide layer 84 except for a portion thereof that forms inner sidewall (oxide) spacers 46. Oxide layers 24 and 40 are also removed, as well as the portion of oxide layer 38 in the center of second trench 35. The resulting structure is shown in FIG. 5B.

Figure 5C:
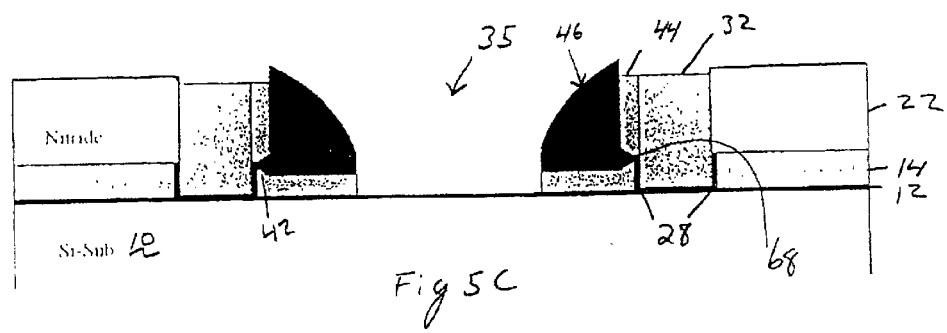

A poly RIE etch process is then performed, which removes the portion of the polysilicon layer 14 that is exposed at the bottom of second trenches 35. This poly etch process also removes a small portion from the tops of poly blocks 32 and poly spacers 44. The resulting structure is shown in FIG. 5C.

Figure 5D:
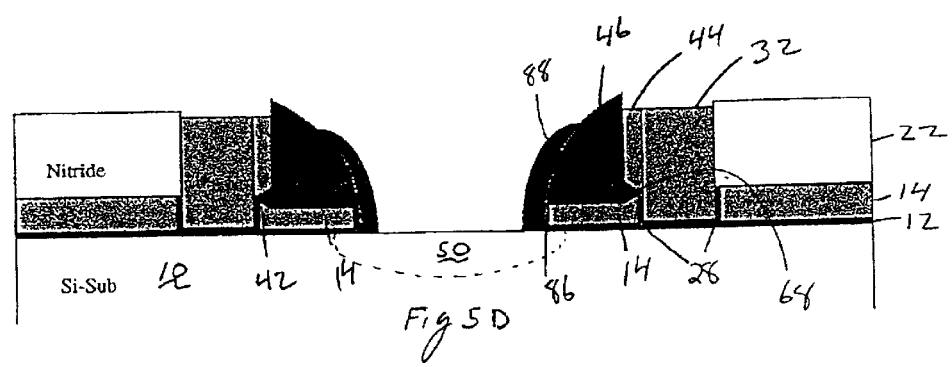

Next, the exposed polysilicon is oxidized to form an oxide layer 86 on the inner sidewalls of what becomes floating gates 14. This is followed by suitable ion implantation across the entire surface of the structure. Where the ions have sufficient energy to penetrate the first silicon dioxide layer 12, they then form a first region 50 (i.e. a second terminal) in the substrate 10. In all other regions, the ions are absorbed and have no effect. Inner sidewall spacers 88 are formed next along the sidewalls of second trenches 35 by either oxide or nitride deposition. In the embodiment shown in FIG. 5D, inner sidewall spacers 88 are formed by oxide deposition, followed by an anisotropic etch which removes the deposited oxide except for the inner sidewall spacers 88. This oxide etch step also removes the exposed oxide layer 12 at the bottom of second trenches 35, to expose the substrate 10. The resulting structure is illustrated in FIG. 5D.

Figure 5E:
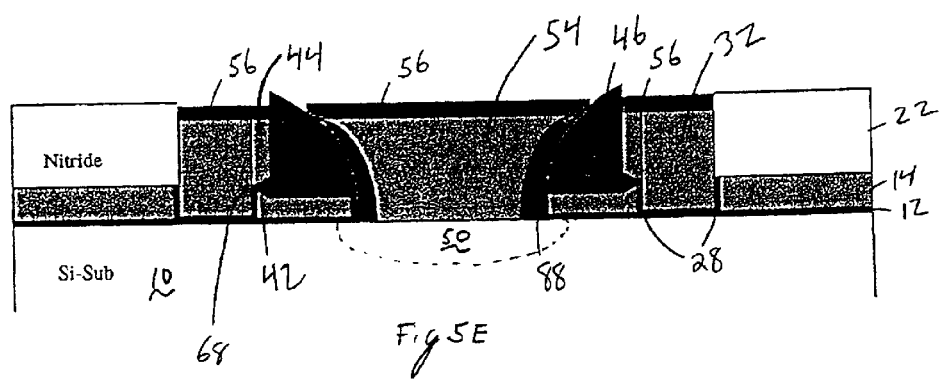

A polysilicon deposition step is then performed, which fills the second trenches 35 with a block 54 of polysilicon. The polysilicon is properly doped either through an in-situ method or by conventional implantation. Excess polysilicon deposited outside the second trenches 35 is etched away, preferably in a CMP etch back process, leaving the top of polysilicon blocks 54 even with the top of poly blocks 32 and poly spacer 44, as illustrated in FIG. 5E. An oxidation step is then performed to oxidize the top surfaces of poly blocks 54 and 32 and poly spacer 44, thus forming oxide layer 56. The resulting structure is illustrated in FIG. 5E.

Figure 5F:
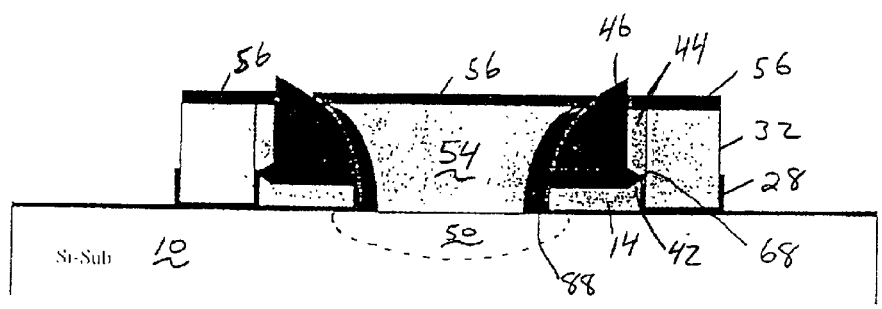

A nitride etch process is used to remove the thick remaining portions of the nitride layer 22 to expose polysilicon layer 14 (outside of second trench 35), which acts as the etch stop. A poly etch process follows to remove the remaining portions of polysilicon layer 14 outside of the selected pairs of poly blocks 32. The resulting structure is illustrated in FIG. 5F, which corresponds to the structure of the preferred embodiment shown in FIG. 2K. The remaining steps of the preferred embodiment can be used to finish forming the final memory cell structure.

Figure 6A:
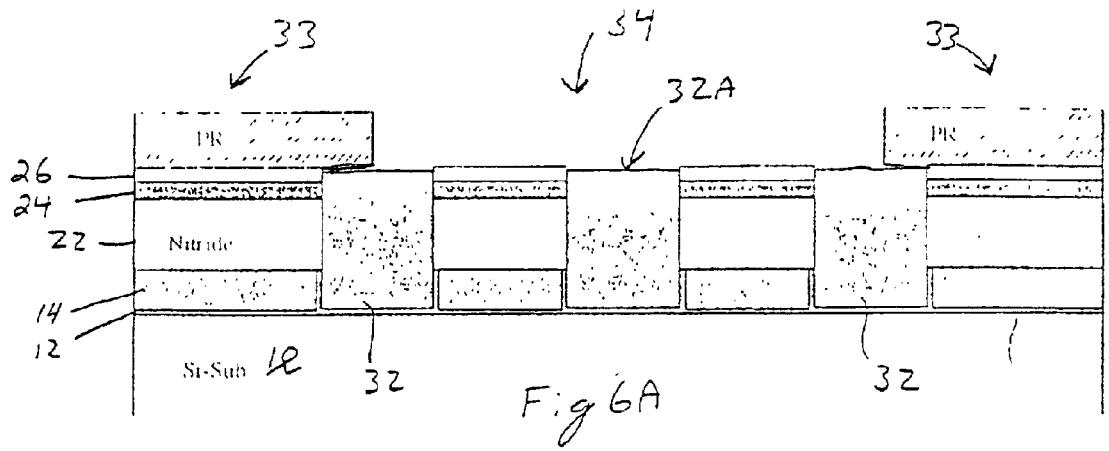
FIGS. 6A–6I are cross sectional views taken along the line 2—2 illustrating in sequence the steps in a fourth alternate processing of the structure shown in FIGS. 2A–2C to form the non-volatile memory array of floating memory cells of the split gate type.

FIGS. 6A–6I illustrate an alternate process in forming the mirror sets of cells. This alternate process begins with the same steps as described with respect to FIGS. 2A–2C, except three first trenches 30 are formed for each pair of mirror memory cells, instead of two. Thus, three blocks of polysilicon are formed for each memory cell pair, the additional block being identified as 32A, as illustrated in FIG. 6A.

Referring now to FIG. 6A, a nitride etch mask photoresist PR (a hard mask could alternatively be used) is placed over the structure to cover alternate intermediate regions 33 (that eventually form the space between adjacent mirror sets of memory cells), leaving alternate intermediate regions 34 exposed, and thereby effectively selecting pairs of blocks 32 that will be associated together in matching mirror sets of memory cells. The alternate intermediate regions 33 will eventually serve as isolation and bit line connection for the pairs of matching memory cells. It should be noted that the precise location of the photo-resist mask PR is not critical, so long as the edges thereof are located somewhere over the blocks 32. A nitride etch process (wet or dry) is performed, followed by an oxide etch process, and another nitride etch process, to etch away nitride layer 26, pad oxide layer 24, and nitride layer 22 inside the exposed alternate intermediate regions 34. Because the etchant is a selective etchant, the blocks 32 of polysilicon and the FG poly layer 14 are unaffected, leaving a pair of second trenches 35 for each memory cell pair, with the FG poly layer 14 exposed at the bottom thereof. For each etch process, the underlying layer acts as an etch stop, and the PR mask prevents any etching in the alternate intermediate regions 33. The etch mask PR is then stripped away.

Figure 6B:
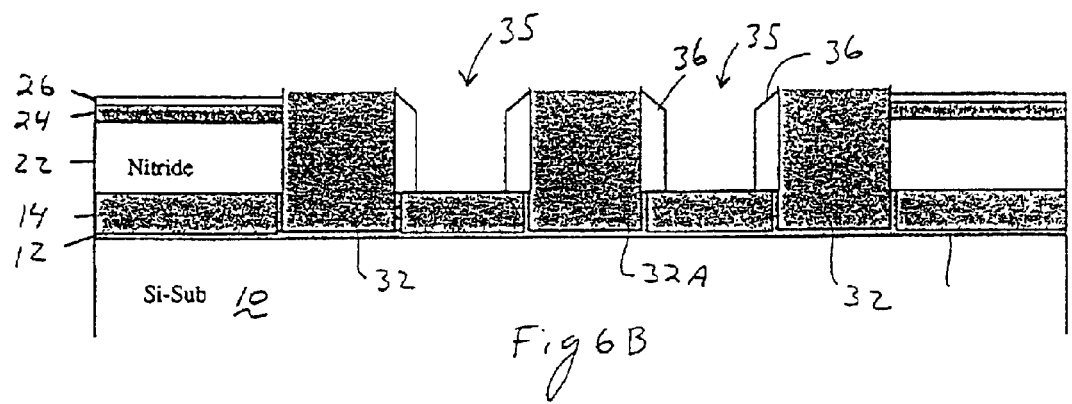

Nitride spacers 36 are then formed along the surfaces of poly blocks 32 and 32A that face second trenches 35. Nitride spacer 36 formation is accomplished by depositing a thin layer of nitride on exposed surfaces of the structure, followed by an anisotropic etch process, such as Reactive Ion Etch (RIE) which is well known in the art, until the nitride layer no longer covers FG poly layer 14 at the center of the second trenches 35. In the process, some silicon nitride 26 atop the silicon oxide 24 may also be etched leaving the blocks 32 and 32A protruding above the plane of the nitride 26. The resulting structure is illustrated in FIG. 6B.

Figure 6C:
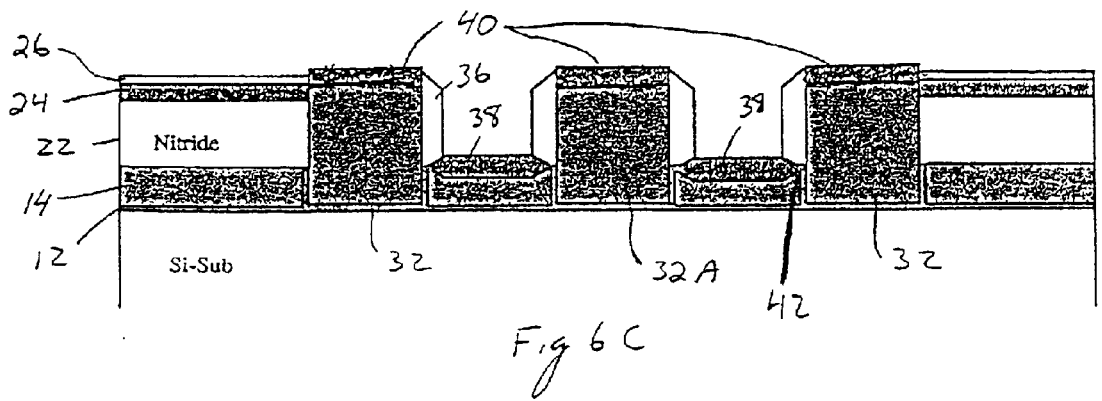

The next step is an oxidation process, which oxidizes the exposed polysilicon surfaces (i.e. polysilicon layer 14 inside of second trenches 35, and polysilicon blocks 32 and 32A) to form an oxide layer 38 over polysilicon layer 14 and another oxide layer 40 over polysilicon blocks 32 and 32A, as illustrated in FIG. 6C. This oxidation step results in oxide layer 38 being formed in a lens shape with side edges thereof joining with FG side oxide walls 28 to form an insulation layer that is disposed adjacent and over the polysilicon layer 14, and in the formation of upwardly projecting sharp edges 42 at each side edge of polysilicon layer 14 located inside second trenches 35. The sharp edges 42 and the thickness of the insulation layer formed by layers 28/38 permit Fowler-Nordheim tunneling of the charges therethrough. While not shown, an optional poly etch process can be performed before the formation of oxide layer 38. This optional customized anisotropic poly etch process etches away a portion of the top surface of poly layer 14, but leaves a taper shape in that top surface in the area next to poly blocks 32, which helps start the formation of sharp edges 42.

Figure 6D:
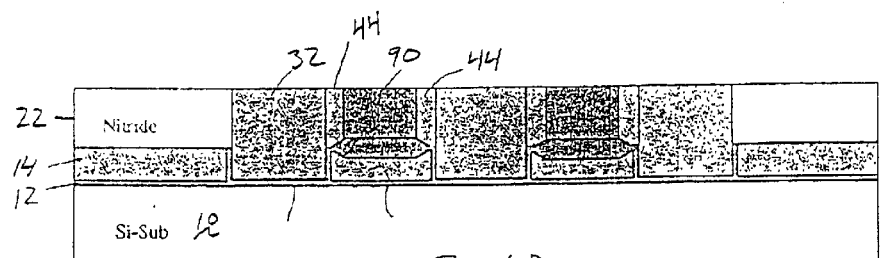

The nitride spacers 36 and nitride layer 26 are then stripped away, preferably using a wet etch process (or other isotropic etch process). WL thin polysilicon spacers 44 are then added, as illustrated in FIG. 6D. The WL thin poly spacers 44 are formed by first depositing a thin layer of polysilicon, followed by an anisotropic etch process (e.g. RIB), which removes all of the thin layers of polysilicon except for WL thin poly spacers 44, along with poly layer 24. The poly blocks 32 and half of the WL thin poly spacers 44 form the control gates (described later) having notches that face the corresponding sharp edges 42, but are insulated therefrom by an insulation layer formed by FG oxide sidewalls 28 and oxide layer 38. An insulation deposition step, such as oxide deposition, is then performed, which fills the second trenches 35 with a block 90 of oxide. Excess oxide deposited outside the second trenches 35 is etched away, preferably in a CMP etch back process, leaving the tops of oxide blocks 90 even with the tops of poly blocks 32 and 32A and WL poly spacers 44. The resulting structure is illustrated in FIG. 6D.

Figure 6E:
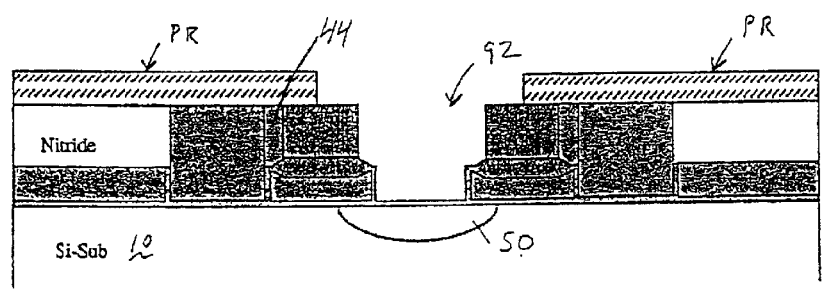

A polysilicon photo-resist etch mask PR is placed over the structure, leaving exposed only the center poly block 32A for each memory cell pair, and the poly spacers 44 immediately adjacent to the center poly block 32A, as illustrated in FIG. 6E. Then, a poly etch process is used to remove the center poly block 32A and adjacent poly spacers 44, forming a trench 92 that extends down to insulation layer 12. Suitable ion implantation is then made across the entire surface of the structure. Where the ions have sufficient energy to penetrate the first silicon dioxide layer 12 in trench 92, they then form a first region 50 (i.e. a second terminal) in the substrate 10. In all other regions, the ions are absorbed by the etch mask or oxide, poly, or nitride layers, where they have no effect. The resulting structure is illustrated in FIG. 6E.

Figure 6F:
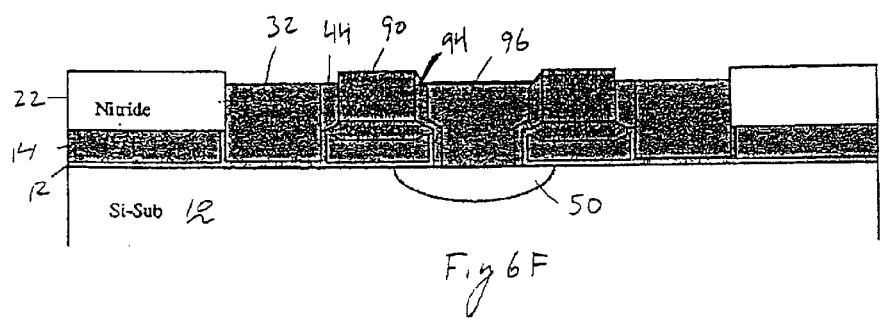

Next, etch mask PR is stripped away, and an insulation spacer 94 is formed on the sidewalls of trench 92. Preferably insulation spacer 94 is an oxide spacer formed by depositing a layer of oxide over the structure, and performing an anisotropic oxide etch to remove the deposited oxide layer except for spacer 94, as well as oxide layer 12 at the bottom of trenches 92 to expose the substrate. A polysilicon deposition step is then performed, which fills the trenches 92 with a block 96 of polysilicon. The polysilicon is properly doped either through an in-situ method or by conventional implantation. Excess polysilicon deposited outside the trenches 92 is etched away, preferably in a CMP etch back process, leaving the tops of polysilicon blocks 32 and 96 and polysilicon spacers 44 slightly below the top surface of the nitride layer 22 and the oxide block 90. The resulting structure is illustrated in FIG. 6F.

Figure 6G:
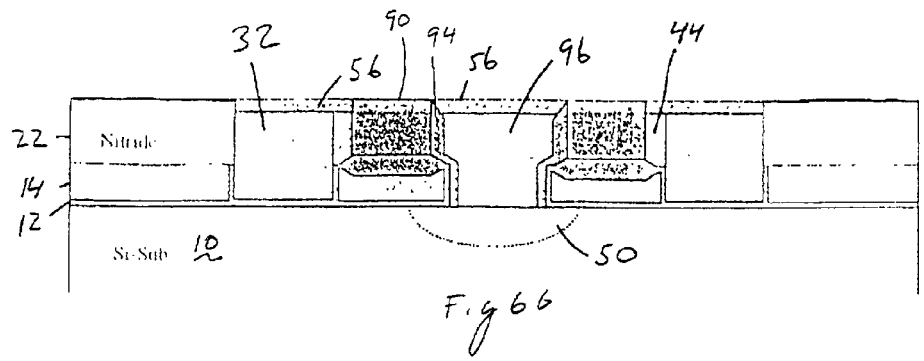
Figure 6H:
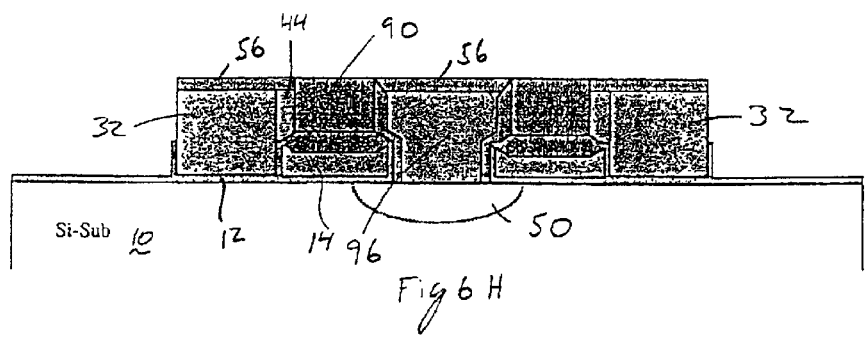

An oxidation step is then performed to oxidize the top surfaces of poly blocks 32 and 96 and poly spacer 44, thus forming oxide layer 56, as illustrated in FIG. 6G. A nitride etch follows to remove the remaining portions of the nitride layer 22 to expose polysilicon layer 14 (outside of poly blocks 32), which act as the etch stop. A poly etch process follows to remove the remaining portions of polysilicon layer 14 outside of the pairs of poly blocks 32. The resulting structure is shown in FIG. 6H.

To complete the memory cells, nitride side wall spacers 58 are formed next to poly blocks 32 by first forming a layer of oxide by thermal oxidation or by CVD to cover/encapsulate the poly block 32, which is followed by depositing a layer of nitride over the structure, and performing an anisotropic nitride etch. Ion implantation (e.g. N+) is then used to form second regions (i.e. first terminals) 60 in the substrate in the same manner as the first regions 50 were formed. An oxide etch is used to remove oxide layer 56, top portions of oxide block 90 and spacers 94, and oxide layer 12 next to spacers 58 to expose substrate 10. A poly etch follows, removing the top portions of poly blocks 32 and 96, and poly spacers 44. A metal deposition step is then formed, using a conductive metal such as tungsten, cobalt, titanium, nickel, platinum or molybdenum. The structure is annealed, permitting the hot metal to flow and seep into the exposed top portions of the substrate 10 to form metalized silicon (salicide) regions 62, and into the exposed top portions of poly blocks 32/96 to form metalized silicon (polycide) regions 65 (which facilitates conduction in the row direction). The metal deposited on the remaining structure is removed by a metal etch process. Metalized silicon (salicide) region 62 on substrate is self aligned to the second regions 60 by spacers 58. Passivation, such as BPSG 67, is used to cover the entire structure. A masking step is performed to define etching areas over the salicide regions 62.

Figure 6I:
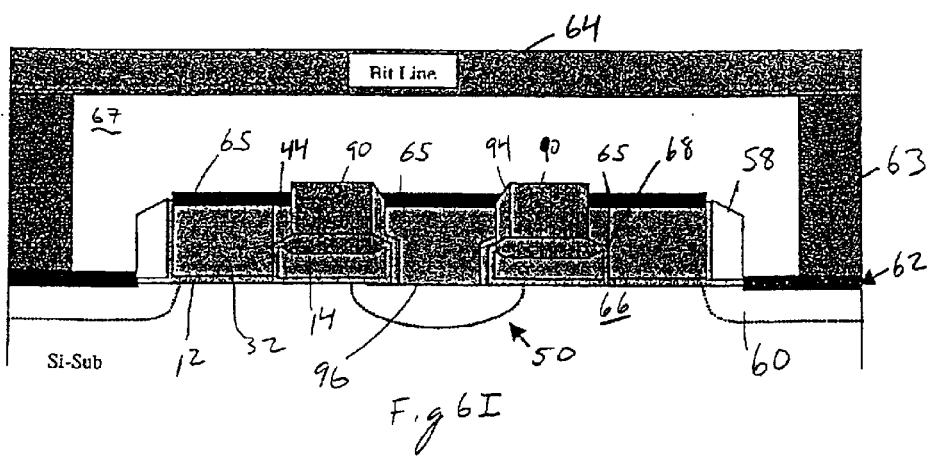

The BPSG 67 is selectively etched in the masked regions down to salicide regions 62, and the resulting trenches are filled with a conductor metal 63 metal deposition and a planarization etch-back process. The salicide layers 62 facilitate conduction between the conductor 63 and second regions 60. A bit line 64 is added by metal masking over the BPSG 67, to connect together all the conductors 63 in the column of memory cells. The final memory cell structure is illustrated in FIG. 6I. First and second regions 50/60 form the source and drain for each cell (those skilled in the art know that source and drain can be switched during operation). The channel region 66 for each cell is the portion of the substrate that is in-between the source and drain 50/60. Poly blocks 32 and poly spacers 44 constitute the control gate, and poly layer 14 constitutes the floating gate. The control gate 32 has one side aligned to the edge of the second region 60, and is disposed over part of the channel region 66. A notch 68 is formed in the corner of the control gate 32/44 (where poly block 32 is attached to poly spacer 44) which partially extends over the floating gate 14 (sharp edge 42 of floating gate 14 extends into the notch 68). Floating gate 14 is over part of the channel region 66, is partially overlapped at one end by the control gate 32/44, and partially overlaps the first region 50 with its other end. As illustrated in the FIG. 6I, the process of the present invention forms pairs of memory cells that mirror each other. The mirrored memory cells are insulated from each other by oxide spacer 94 and oxide layer 28 at the end of the ends of the floating gates 14.

This embodiment is unique in that while the floating gate length is still defined by a photolithography step, it is the floating gate poly that is protected by the etching mask, instead of the floating gate poly being exposed to the mask opening. The WL mask defines the word line, floating gate and Source dimensions at the same time. The floating gate length is dictated by a photo lithography step instead of a spacer etch process, and is therefore more controllable.

Figure 7A:
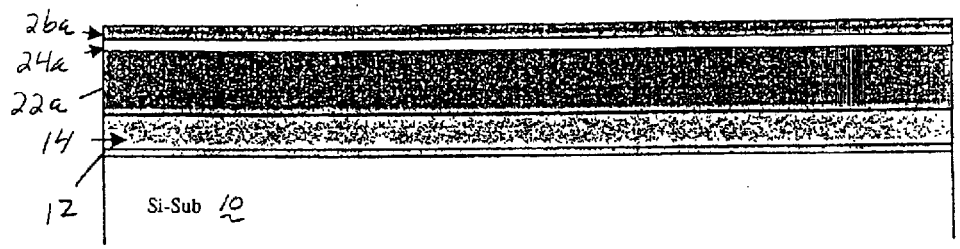
FIGS. 7A–7S are cross sectional views taken along the line 2—2 illustrating in sequence the steps in a fifth alternate processing of the structure shown in FIG. 2A to form the non-volatile memory array of floating memory cells of the split gate type.

FIGS. 7A–7I illustrate an alternate process that is very similar to the process illustrated in FIGS. 6A–6I, but further includes a self-aligned-contact scheme (SAC). This alternate process begins with the same steps as described with respect to FIG. 2A, except insulation layers 22a and 26a are formed of oxide instead of nitride, and insulation layer 24a is formed of nitride instead of oxide, as illustrated in FIG. 7A. Layers 24a and 26a are optional, but included in the description of this embodiment.

Figure 7B:
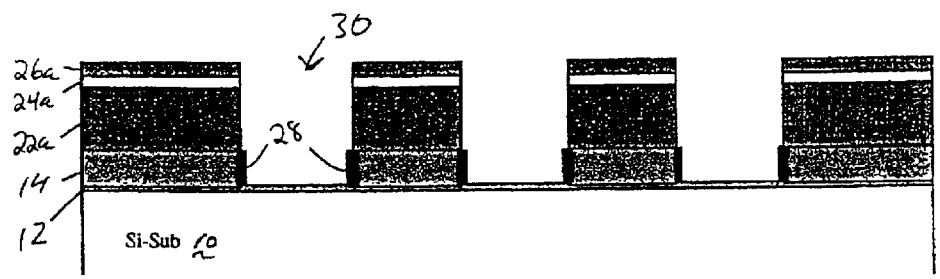

A WL masking operation is performed with photo-resist applied on top of the oxide layer 26a. A masking step is applied in which stripes (i.e. masking regions) are defined in the X or the row direction. The photo resist is removed in defined masking regions, i.e. stripes in the row direction, after which well known anisotropic oxide, polysilicon and nitride etch processes are used to selectively remove insulation layers 26a, 24a, and 22a, as well as poly layer 14 underlying the removed photo resist in the stripes until the insulation layer 12 is observed, which acts as an etch stop. These etch processes result in the formation of the three first trenches 30 for each pair of mirror memory cells. An oxidation step follows, where the sides of polysilicon layer 14 that are exposed inside first trenches 30 and 32A are oxidized to form FG oxide sidewalls 28. The remaining photo-resist is then removed. The resulting structure is shown in FIG. 7B.

Figure 7C:
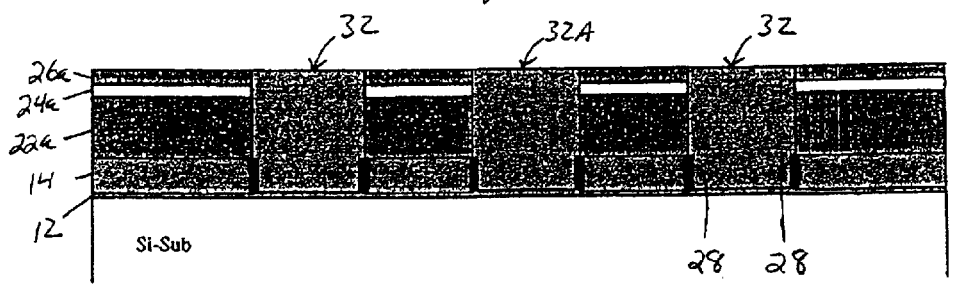
Figure 7D:
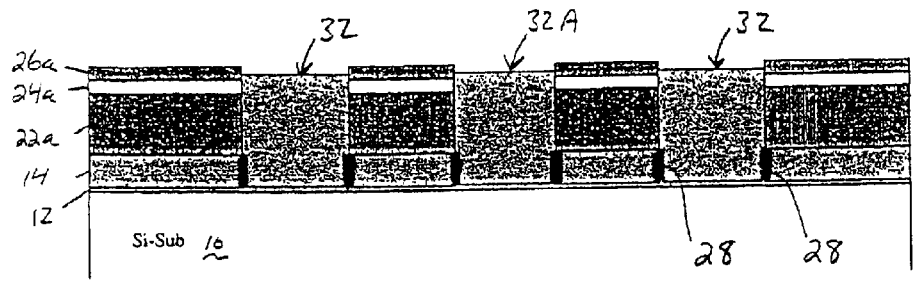

A polysilicon deposition step is then performed, which for each pair of mirror memory cells fills the outer two first trenches 30 with blocks 32 of polysilicon, and the middle first trench 30 with a block 32A of polysilicon. Excess polysilicon deposited outside first trenches 30 and 30A is etched away, preferably in a CMP etch back process that uses the top oxide layer 26a as a CMP stopping layer, leaving the tops of polysilicon blocks 32 and 32A substantially even with the oxide layer 26a. Blocks 32 and 32A are substantially rectangular in shape, as illustrated in FIG. 7C. A polysilicon etch back step is then performed, to etch away the top portion of poly blocks 32 and 32A, as illustrated in FIG. 7D.

Figure 7E:
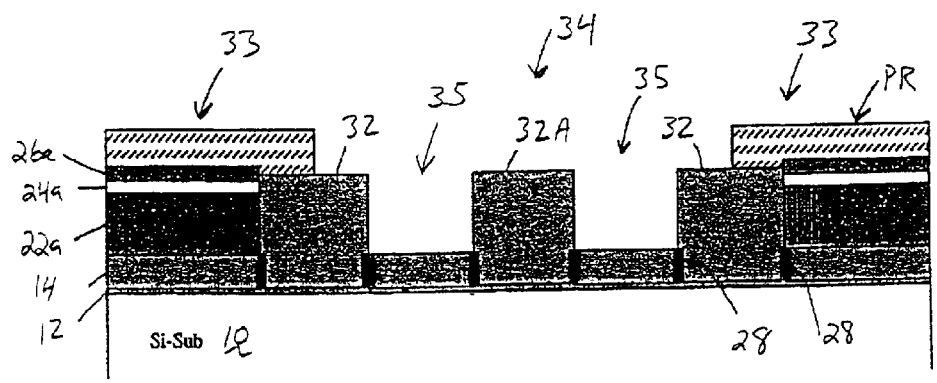

Referring now to FIG. 7E, an oxide etch mask photo-resist PR (a hard mask could alternatively be used) is placed over the structure to cover alternate intermediate regions 33 (that eventually form the space between adjacent mirror sets of memory cells), leaving alternate intermediate regions 34 exposed, and thereby effectively selecting pairs of blocks 32 that will be associated together in matching mirror sets of memory cells. The alternate intermediate regions 33 will eventually serve as isolation and bit line connection for the pairs of matching memory cells. It should be noted that the precise location of the photo-resist mask PR is not critical, so long as the edges thereof are located somewhere over the blocks 32. An oxide etch process is performed, followed by a nitride etch process (wet or dry), and another oxide etch process, to etch away oxide layer 26a, nitride layer 24a, and oxide layer 22a inside the exposed alternate intermediate regions 34. Because the etchant is a selective etchant, the blocks 32 and 32A of polysilicon and the FG poly layer 14 are unaffected, leaving a pair of second trenches 35 for each memory cell pair, with the FG poly layer 14 exposed at the bottom thereof. For each etch process, the underlying layer acts as an etch stop, and the PR mask prevents any etching in the alternate intermediate regions 33. The resulting structure is shown in FIG. 7E.

Figure 7F:
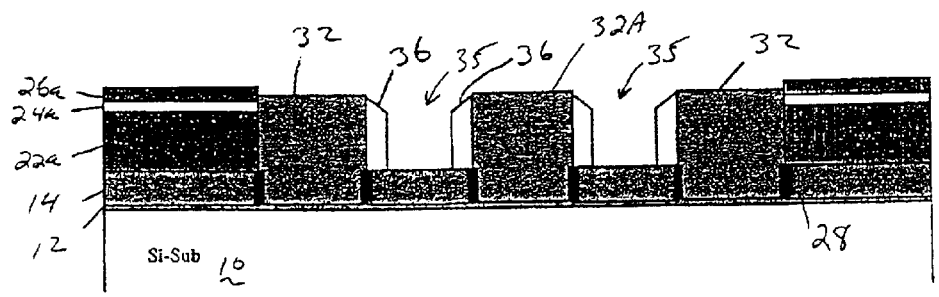

The etch mask PR is then stripped away. Nitride spacers 36 are then formed along the surfaces of poly blocks 32 and 32A that constitute the sidewalls of second trenches 35. Nitride spacer 36 formation is accomplished by depositing a thin layer of nitride on exposed surfaces of the structure, followed by an anisotropic etch process, such as Reactive Ion Etch (RIE) which is well known in the art, until the nitride layer no longer covers FG poly layer 14 at the center of second trenches 35. The resulting structure is illustrated in FIG. 7F.

Figure 7G:
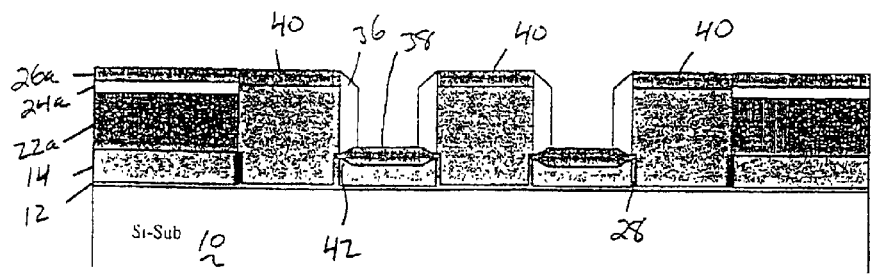

The next step is an oxidation process, which oxidizes the exposed polysilicon surfaces (i.e. polysilicon layer 14 inside of second trenches 35, and polysilicon blocks 32 and 32A) to form an oxide layer 38 over polysilicon layer 14 and another oxide layer 40 over polysilicon blocks 32 and 32A, as illustrated in FIG. 7G. This oxidation step results in oxide layer 38 being formed in a lens shape with side edges thereof joining with FG side oxide walls 28 to form an insulation layer that is disposed adjacent and over the polysilicon layer 14, and in the formation of upwardly projecting sharp edges 42 at each side edge of polysilicon layer 14 located inside second trenches 35. The sharp edges 42 and the thickness of the insulation layer formed by layers 28/38 permit Fowler-Nordheim tunneling of the charges therethrough. While not shown, an optional poly etch process can be performed before the formation of oxide layer 38. This optional customized anisotropic poly etch process etches away a portion of the top surface of poly layer 14, but leaves a taper shape in that top surface in the area next to poly blocks 32, which helps start the formation of sharp edges 42.

Figure 7H:
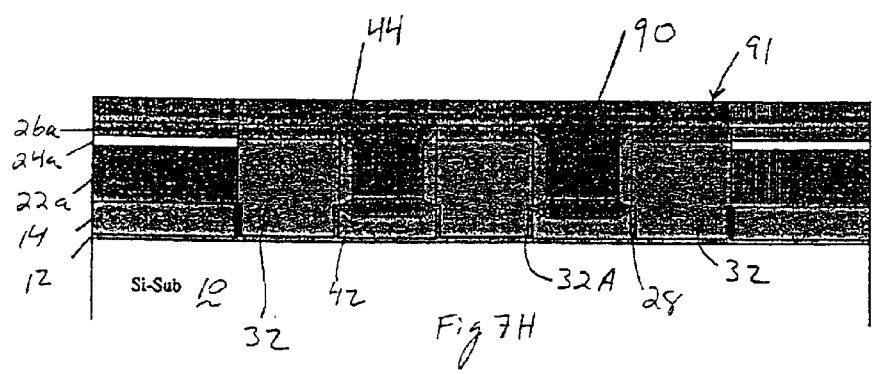

The nitride spacers 36 are then stripped away, preferably using a wet etch process (or other isotropic etch process). WL thin polysilicon spacers 44 are then added, as illustrated in FIG. 7H. The WL thin poly spacers 44 are formed by first depositing a thin layer of polysilicon, followed by an anisotropic etch process (e.g. RIE), which removes all of the thin layers of polysilicon except for WL thin poly spacers 44. The poly blocks 32 and half of the WL thin poly spacers 44 form the control gates (described later) having notches that face the corresponding sharp edges 42, but are insulated therefrom by an insulation layer formed by FG oxide sidewalls 28 and oxide layer 38. An insulation deposition step, such as oxide deposition, is then performed, which fills the second trenches 35 with a block 90 of oxide, and a thick oxide layer 91 over the structure. The resulting structure is shown in FIG. 7H.

Figure 7I:
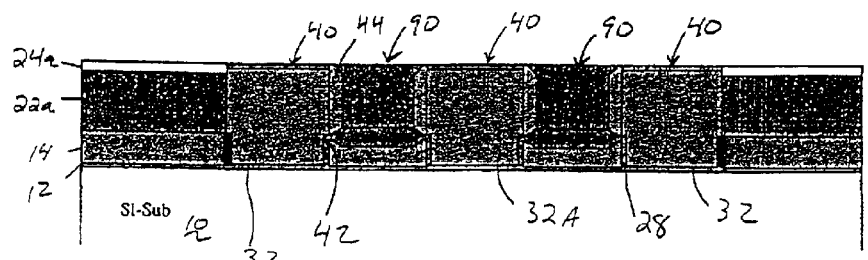
Figure 7J:
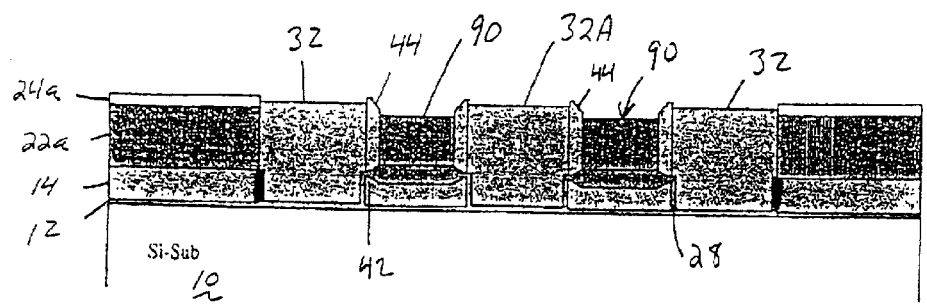

Excess oxide deposited outside the second trenches 35 (oxide layer 91) is etched away, along with oxide layer 26a and most of oxide layer 40, preferably in a CMP etch back process, leaving the tops of oxide blocks 90 even with nitride layer 24a and oxide layer 40 (FIG. 7I). An oxide etch back step is then used to remove oxide layer 40 on top of poly blocks 32, and remove top portions of oxide blocks 90. The resulting structure is shown in FIG. 7J.

Figure 7K:
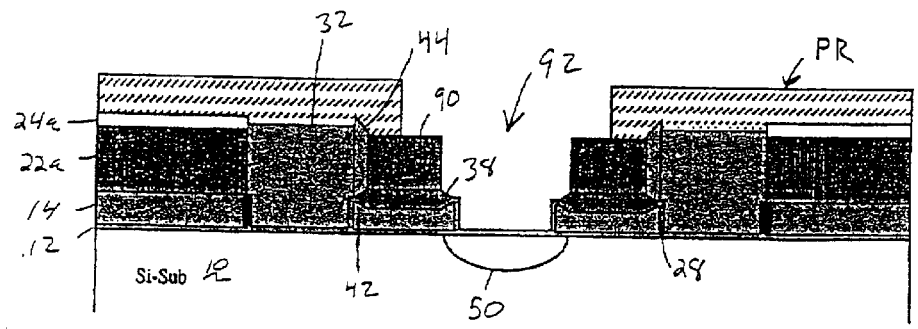

A polysilicon photo-resist etch mask PR is placed over the structure, leaving exposed only the center poly block 32A for each memory cell pair, and the poly spacers 44 immediately adjacent to the center poly block 32A, as illustrated in FIG. 7K. Then, a poly etch process is used to remove the center poly block 32A and adjacent poly spacers 44, forming a trench 92 that extends down to insulation layer 12. Suitable ion implantation is then made across the entire surface of the structure. Where the ions have sufficient energy to penetrate the first silicon dioxide layer 12 in trench 92, they then form a first region 50 (i.e. a second terminal) in the substrate 10. In all other regions, the ions are absorbed by the etch mask or oxide layers, where they have no effect. The resulting structure is illustrated in FIG. 7K.

Figure 7L:
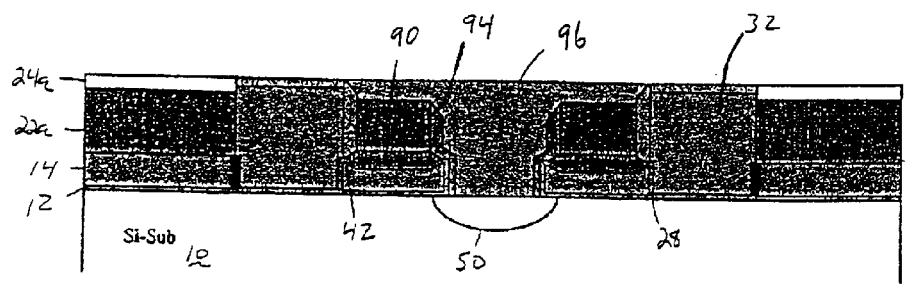

Next, etch mask PR is stripped away, and an insulation spacer 94 is formed on the sidewalls of trench 92. Preferably insulation spacer 94 is an oxide spacer formed by depositing a thin layer of oxide over the structure, and performing an anisotropic oxide etch to remove the deposited oxide layer except for spacer 94, a top portion of oxide blocks 90, as well as oxide layer 12 at the bottom of trenches 92 to expose the substrate. A polysilicon deposition step is then performed, which fills the trenches 92 with a block 96 of polysilicon that extends over the tops of oxide blocks 90 and over the poly blocks 32. The polysilicon is properly doped either through an in-situ method or by conventional implantation. Excess polysilicon deposited outside the trenches 92 is etched away, preferably in a CMP etch back process, leaving the tops of polysilicon blocks 96 and 32 even with the top surface of the nitride layer 24a. The resulting structure is illustrated in FIG. 7L. A poly etch back process is then performed to remove the top portions of poly blocks 32 and 96, and poly spacer 44. Oxide blocks 90 and oxide spacers 94 are left to extend well above the top surface of poly blocks 32/96 and poly spacers 44, as illustrated in FIG. 7M.

A layer of metalized polysilicon (polycide) 100 is then formed in the top portions of poly blocks 32 and 96 by depositing a metal such as tungsten, cobalt, titanium, nickel, platinum or molybdenum over the structure. The structure is annealed, permitting the hot metal to flow and seep into the exposed top portions of poly blocks 32/96 to form polycide regions 100 that facilitate conduction in the row direction. The metal deposited on the remaining structure is removed by a metal etch process. A thick layer of nitride 102 is then deposited over the structure, as illustrated in FIG. 7N. A nitride etch back process, such as CMP, is performed to remove nitride layers 24a and 102 from the tops of oxide layer 22a, and make the remaining top surface of nitride layer 102 match that of oxide layer 22a. The resulting structure is illustrated in FIG. 7O.

Figure 7P:
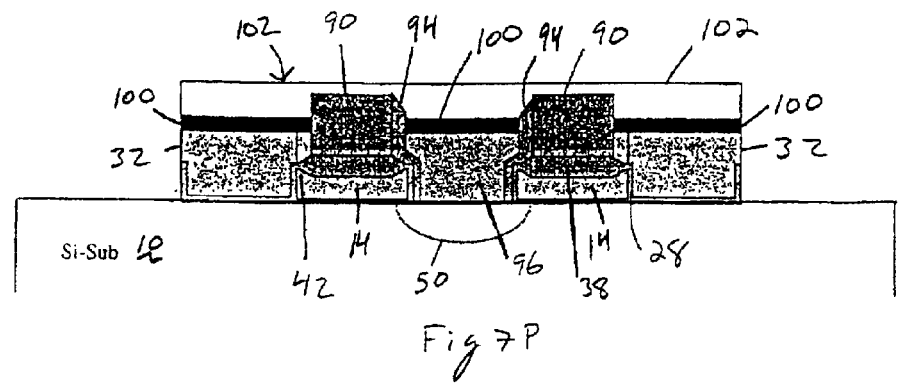

An anisotropic oxide etch process is used to remove the remaining exposed portions of the oxide layer 22a from either side of the mirror cell sets to expose polysilicon layer 14 (outside of poly blocks 32), which act as the etch stop. A poly etch process follows to remove the remaining exposed portions of polysilicon layer 14 outside of the pairs of poly blocks 32. An optional oxide etch process is then used to remove the remaining exposed portions of oxide layer 12 outside of the pairs of poly blocks 32. The resulting structure is shown in FIG. 7P.

Figure 7Q:
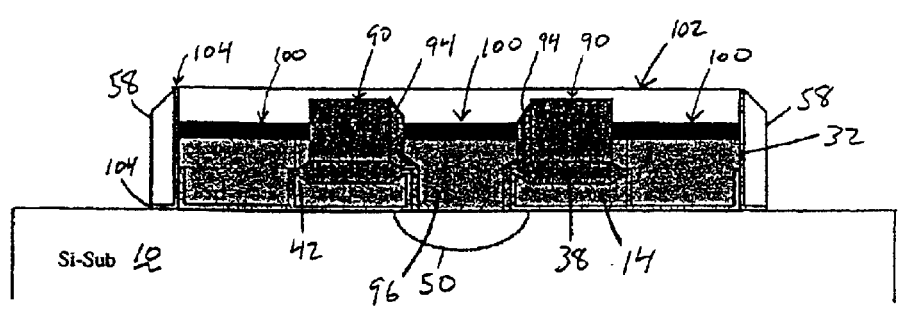

To complete the memory cells, nitride side wall spacers 58 are formed next to poly blocks 32 by first forming a layer of oxide 104 by thermal oxidation or by CVD to cover/encapsulate the poly block 32. A layer of nitride is then deposited over the structure, and an anisotropic nitride etch is performed to remove all the nitride except for spacers 58. A thin oxide etch is performed to remove any exposed portions of thin oxide layer 104. The resulting structure is shown in FIG. 7Q.

Figure 7R:
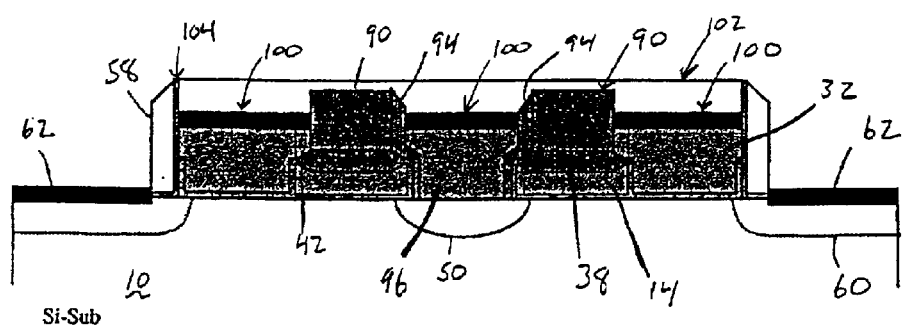
Figure 7P:
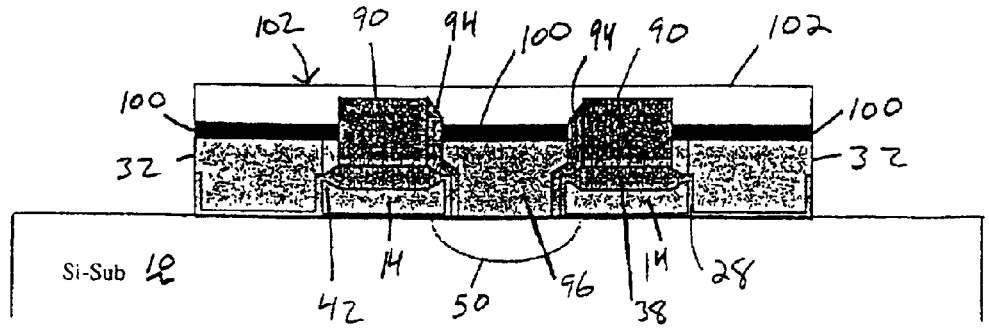
Figure 7Q:
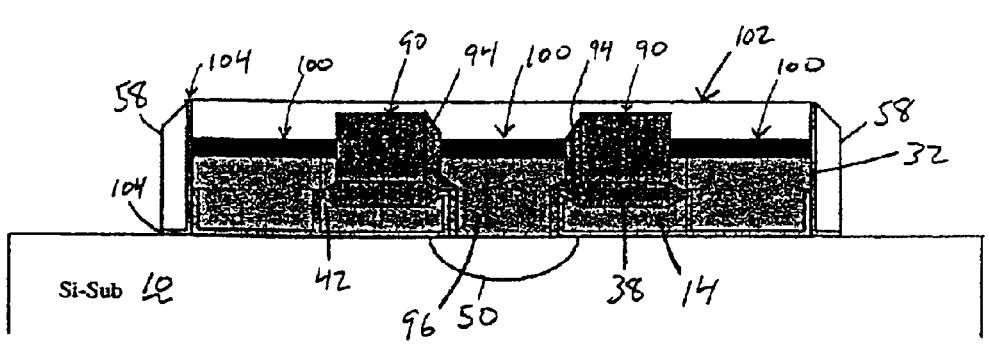
Figure 7R:
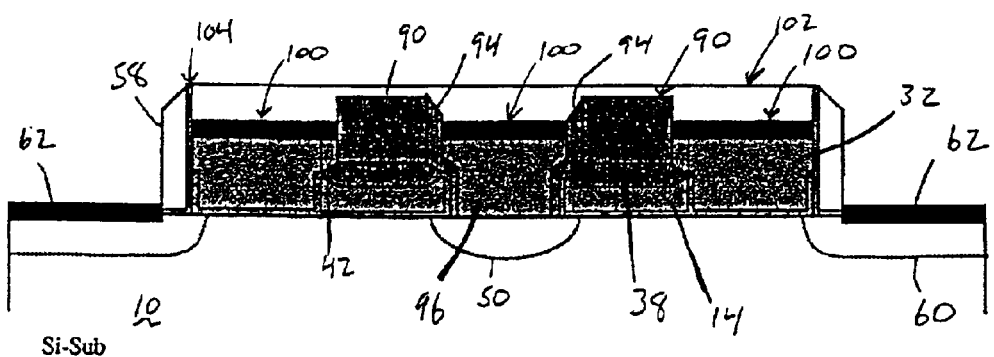

Ion implantation (e.g. N+) is then used to form second regions 60 (i.e. first terminals) in the substrate in the same manner as the first regions 50 were formed. A layer of metalized silicon (salicide) 62 is then formed in the top of the substrate 10 next to side wall spacers 58 by depositing a metal over the structure. The structure is annealed, permitting the hot metal to flow and seep into the exposed top portions of the substrate 10 to form salicide regions 62. The metal deposited on the remaining structure is removed by a metal etch process. Salicide regions 62 on substrate are self aligned to the second regions 60 by spacers 58. The resulting structure is shown in FIG. 7R.

Passivation, such as BPSG 67, is used to cover the entire structure. A masking step is performed to define etching areas over the salicide regions 62. The BPSG 67 is selectively etched in the masked regions to create contact openings that are ideally centered over and wider than the salicide regions 62 formed between adjacent sets of paired memory cells. Nitride layer 102 serves to protect poly blocks 32 and polycide layers 100 from this etch process. The contact openings are then filled with a conductor metal 63 by metal deposition and planarization etch-back, whereby the entire area between nitride spacers 58 of adjacent sets of paired memory cells is filled with the deposited metal to form contact conductors 63 that are self aligned to the salicide regions 62 by the nitride spacers 58 (i.e. self aligned contact scheme, or SAC). The salicide layer 62 facilitates conduction between the conductors 63 and second regions 60. A bit line 64 is added by metal masking over the BPSG 67, to connect together all the conductors 63 in the column of memory cells. The final memory cell structure is illustrated in FIG. 7S.

The self aligned contact scheme (SAC) removes an important constraint on the minimum spacing requirement between adjacent sets of paired memory cells. Specifically, while FIG. 7S illustrates the contact area (and thus conductors 63) perfectly centered over the salicide regions 62, in reality it is very difficult to form the contact openings without some undesirable horizontal shift relative to the salicide regions 62. A faulty connection could occur if the horizontal shift becomes great enough to prevent contact 63 from filling in the space between spacers 58. With a non-self aligned contact scheme, such as that used with the embodiment illustrated in FIG. 2L, where there is no protective layer of nitride over the structure before BPSG formation, electrical shorts can occur if the contact 63 is shifted over and formed over polycide layer 65 and poly block 32. To prevent electrical shorts in the non-self aligned contact scheme, the contact openings are formed sufficiently away from the nitride spacers 58 so that even with the maximum possible shift in the contact regions, they will not extend to nitride spacers 58 or beyond. This of course presents a constraint on the minimum distance between spacers 58 for the embodiment shown in FIG. 2L, in order to provide a sufficient tolerance distance between adjacent sets of paired mirror cells.

Figure 7S:
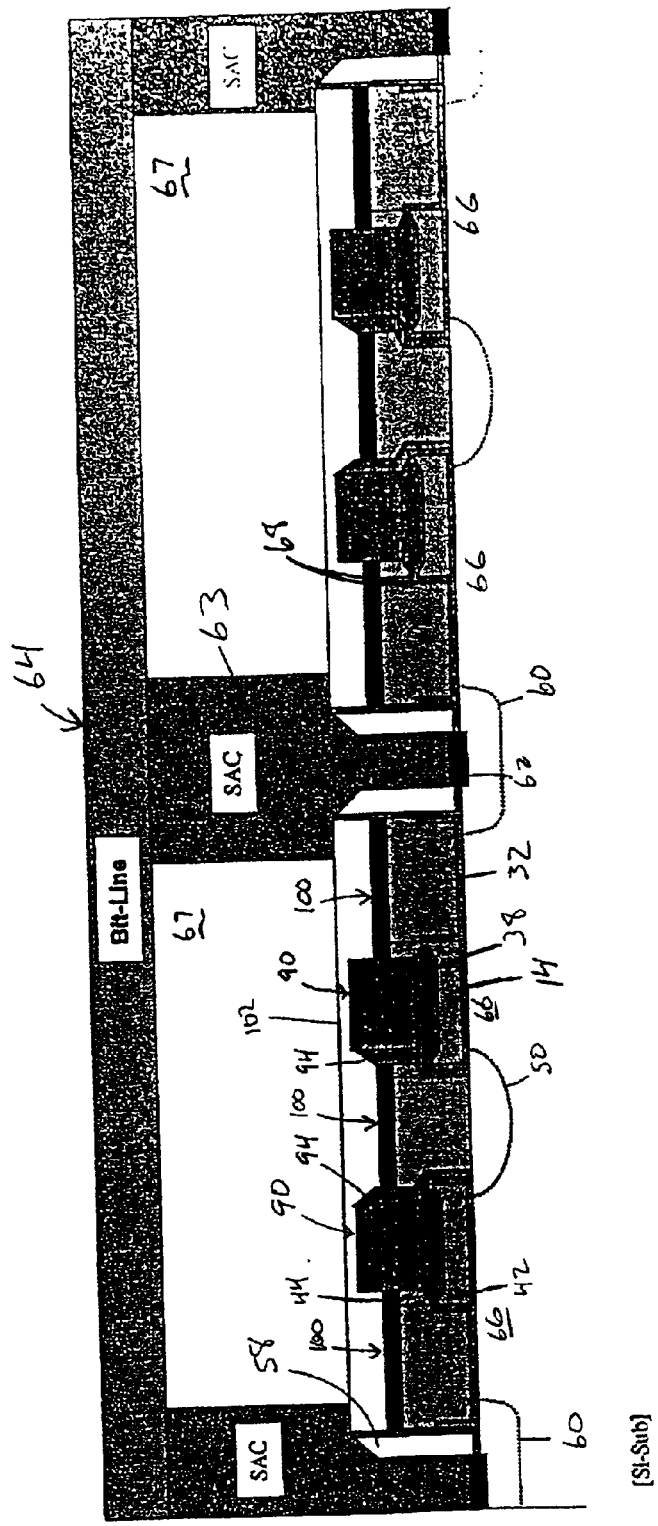

SAC as used in the embodiment of FIG. 7S eliminates this constraint by using a protective layer of material (nitride layer 102) underneath the BPSG. With this protective layer, the contact openings are formed in the BPSG with a sufficient width to ensure there is overlap of the contact opening with the salicide regions 62, even if there is a significant horizontal shift of the contact opening during formation. Nitrite layer 102 allows portions of contact 63 to be formed over poly block 32 or polycide layer 100, without any shorting therebetween. The wide contact opening guarantees that contacts 63 completely fill the very narrow spaces between spacers 58, and makes good electrical contact with salicide regions 62. Thus, the width of contact regions between spacers 58 can be minimized, allowing the scaling down of the overall cell dimension. It should be noted that SAC can be utilized with any of the methods illustrated in this application.

As shown in FIG. 7S, first and second regions 50/60 form the source and drain for each cell (those skilled in the art know that source and drain can be switched during operation). The channel region 66 for each cell is the portion of the substrate that is in-between the source and drain 50/60. Poly blocks 32 and poly spacers 44 constitute the control gate, and poly layer 14 constitutes the floating gate. The control gate 32/44 has one side aligned to the edge of the second region 60, and is disposed over part of the channel region 66. A notch 68 is formed in the corner of the control gate, which partially extends over the floating gate 14 (sharp edge 42 of floating gate 14 extends into the notch 68). Floating gate 14 is over part of the channel region 66, is partially overlapped at one end by the control gate 32/44, and partially overlaps the first region 50 with its other end. As illustrated in the FIG. 7S, the process of the present invention forms pairs of memory cells that mirror each other. Each pair of mirrored memory cells is insulated from adjacent pairs of mirrored memory cells by oxide layers 104 and nitride spacers 58.

This embodiment is unique in that while the floating gate length is still defined by a photolithography step, it is the floating gate poly that is protected by the etching mask, instead of the floating gate poly being exposed to the mask opening. The WL mask defines the word line, floating gate and source dimensions at the same time. In addition, this embodiment utilizes a self aligned contact scheme to align conductors 63 to the appropriate salicide regions 62, which are self aligned to the second regions 60. Thus, all the critical components in the memory cell, namely the floating gate, first source region, wordline (control gate), and the contact conductor are all self aligned together. Also, this embodiment further forms a control gate like all the embodiments described herein, namely a control gate having a planar sidewall portion which faces toward the floating gate. The control gate sidewall provides a planar surface portion to attach poly spacers 44 thereto to form a continuous an integral extension of the control gate, so that the control gate as a whole is both adjacent to and partially over the floating gate. This embodiment further forms a control gate having planar sidewall portions facing toward the second region 60 and facilitate the formation and attachment of insulating side wall spacers 58.

It is to be understood that the present invention is not limited to the embodiments described above and illustrated herein, but encompasses any and all variations falling within the scope of the appended claims. For example, although the foregoing methods describe the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. For example, first trenches 30 and poly blocks 32 could be formed, with sidewalls thereof being thereafter etched away, all before poly layer 14 is formed adjacent poly blocks 32. Finally, various aspects of the embodiments described above could be combined to form the desired memory cell structure.

What is claimed is:

1. An electrically programmable and erasable memory device comprising:

a substrate of semiconductor material of a first conductivity type, first and second spaced-apart terminals in the substrate of a second conductivity tupe, with a channel region therebetween;

a first insulation layer disposed over said substrate;

an electrically conductive floating gate disposed over said first insulation layer and extending over a portion of said channel region and over a portion of the second terminal;

a second insulation layer disposed over and adjacent the floating gate and having a thickness permitting Fowler-Nordheim tunneling of charges therethrough; and an electrically conductive control gate having a first portion and a second portion, the first portion being substantially rectangularly shaped and positioned immediately adjacent to the second insulation layer, the second portion being substantially a spacer connected to the first portion and disposed over the floating gate and insulated therefrom.

2. The device of claim 1, wherein the control gate forms a notch at the connection between the first portion and the second portion.

3. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions;

each of the active regions including a column of memory cells extending in the first direction, each of the memory cells including:

first and second spaced-apart terminals formed in the substrate having a second conductivity type, with a channel region formed in the substrate therebetween, a first insulation layer disposed over said substrate including over said channel region, an electrically conductive floating gate disposed over said first insulation layer and extending over portion of said channel region and over a portion of the second terminal, and a second insulation layer disposed over and adjacent the floating gate and having a thickness permitting Fowler-Nordheim tunneling of charges therethrough; and a plurality of electrically conductive control gates each extending across the active regions and isolation regions in a second direction substantially perpendicular to the first direction and having a first portion that is substantially rectangular in shape and a second portion that is connected to the first portion and is substantially a spacer, wherein each of the control gates intercepts one of the memory cells in each of the active regions such that the first portion is positioned immediately adjacent to the second insulation layer and therein and the second portion is disposed over the floating gate and insulated therefrom.

4. The device of claim 3, wherein the control gate forms a notch at the connection between the first portion and the second portion.

5. An electrically programmable and erasable memory device comprising:

a substrate of semiconductor material of a first conductivity type;

first and second spaced-apart terminals in the substrate of a second conductivity type, with a channel region therebetween;

a first insulation layer disposed over said substrate;

an electrically conductive floating gate disposed over said first insulation layer and extending over a portion of said channel region and over a portion of the second terminal;

a second insulation layer disposed over and adjacent the floating gate and having a thickness permitting Fowler-Nordheim tunneling of charges therethrough; and an electrically conductive control gate having a first portion and a second portion, the first portion having a substantially planar sidewall portion and is positioned immediately adjacent to the second insulation layer, the second portion being substantially a spacer connected to the substantially planar sidewall portion and disposed over the floating gate and insulated therefrom.

6. The device of claim 5, wherein the control gate forms a notch at the connection between the first portion and the second portion.

7. An array of electrically programmable and erasable memory devices comprising:

a substrate of semiconductor material of a first conductivity type;

spaced apart isolation regions formed on the substrate which are substantially parallel to one another and extend in a first direction, with an active region between each pair of adjacent isolation regions;

each of the active regions including a column of memory cells extending in the first direction, each of the memory cells including:

first and second spaced-apart terminals formed in the substrate having a second conductivity type, with a channel region formed in the substrate therebetween, a first insulation layer disposed over said substrate including over said channel region, an electrically conductive floating gate disposed over said first insulation layer and extending over a portion of said channel region and over a portion of the second terminal, and a second insulation layer disposed over and adjacent the floating gate and having a thickness permitting Fowler-Nordheim tunneling charges therethrough; and a plurality of electrically conductive control gates each extending across the active regions and isolation regions in a second direction substantially perpendicular to the first direction and having a first portion that has a substantially planar sidewall portion and a second portion that is connected to the substantially planar sidewall portion and is substantially a spacer, wherein each of the control gates intercepts one of the memory cells in each of the active regions such that the first portion is positioned immediately adjacent to the second insulation layer therein and the second portion is disposed over the floating gate and insulated therefrom.

8. The device of claim 7, wherein the control gate forms a notch at the connection between the first portion and the second portion.

* * * * *